United States Patent [19]
Garrido

[11] Patent Number: 5,959,500
[45] Date of Patent: Sep. 28, 1999

[54] MODEL-BASED ADAPTIVE FEEDFORWARD AMPLIFIER LINEARIZER

[75] Inventor: Armando Cova Garrido, Vancouver, Canada

[73] Assignee: Glenayre Electronics, Inc., Charlotte, N.C.

[21] Appl. No.: 09/013,572

[22] Filed: Jan. 26, 1998

[51] Int. Cl.[6] .................................. H03F 1/00; H04K 1/02
[52] U.S. Cl. ............................................. 330/151; 375/297
[58] Field of Search ................................ 330/2, 149, 151; 375/296, 297

[56] References Cited

U.S. PATENT DOCUMENTS

| | | |
|---|---|---|
| 4,677,390 | 6/1987 | Wagner . |
| 4,879,519 | 11/1989 | Myer . |
| 4,885,551 | 12/1989 | Myer . |
| 4,987,378 | 1/1991 | Eggleston et al. . |
| 5,077,532 | 12/1991 | Obermann et al. . |
| 5,304,945 | 4/1994 | Myer . |
| 5,386,198 | 1/1995 | Ripstrand et al. . |
| 5,404,378 | 4/1995 | Kimura ..................... 375/296 |
| 5,412,342 | 5/1995 | Sakamoto et al. . |
| 5,444,418 | 8/1995 | Mitzlaff . |
| 5,489,875 | 2/1996 | Cavers . |
| 5,574,400 | 11/1996 | Fukuchi . |
| 5,594,385 | 1/1997 | Anvari . |
| 5,606,286 | 2/1997 | Bains . |
| 5,621,354 | 4/1997 | Mitzlaff . |
| 5,808,512 | 9/1998 | Bainvoll et la. ................. 330/151 |
| 5,867,065 | 2/1999 | Leyendecker .................. 330/149 |

Primary Examiner—Robert Pascal
Assistant Examiner—Patricia Nguyen
Attorney, Agent, or Firm—Christensen O'Connor Johnson & Kindness PLLC

[57] ABSTRACT

A linear RF transmitter uses an adaptive forward model of the power amplifier in a feedforward linearization system. The forward model outputs a modeled power amplifier output signal, which is then used to calculate the error signal. The error signal represents the distortion caused by the power amplifier, which is then subtracted from the power amplifier output signal. The forward model can optionally model memory effects of the power amplifier transfer characteristic to more accurately generate the error signal. In addition, the forward model may be generated from the power amplifier output signals using orthogonal predictor variables to further improve performance. These orthogonal predictor values are then used to calculate parameter values used by a feedforward filter to model the power amplifier. A coordinate mapper then maps these calculated parameter values into a set of parameter values having the same coordinate system of the feedforward filter. Still further, in-band distortion may be filtered out of the power amplifier output signal before calculating the parameter values to more accurately model the distortion of the power amplifier.

27 Claims, 12 Drawing Sheets

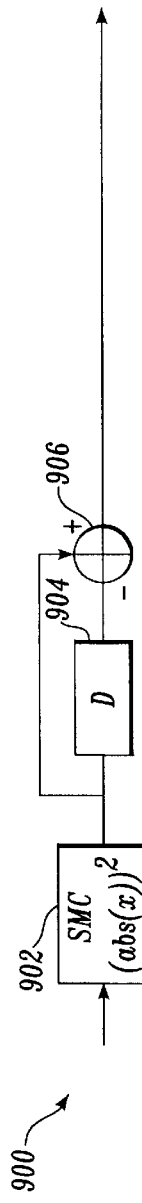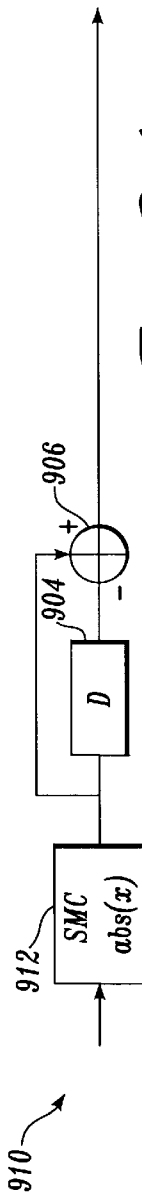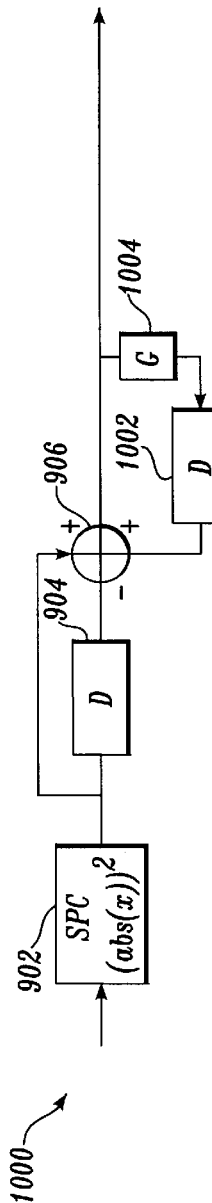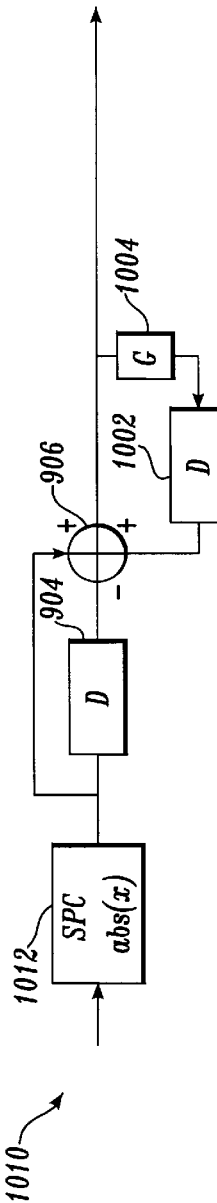

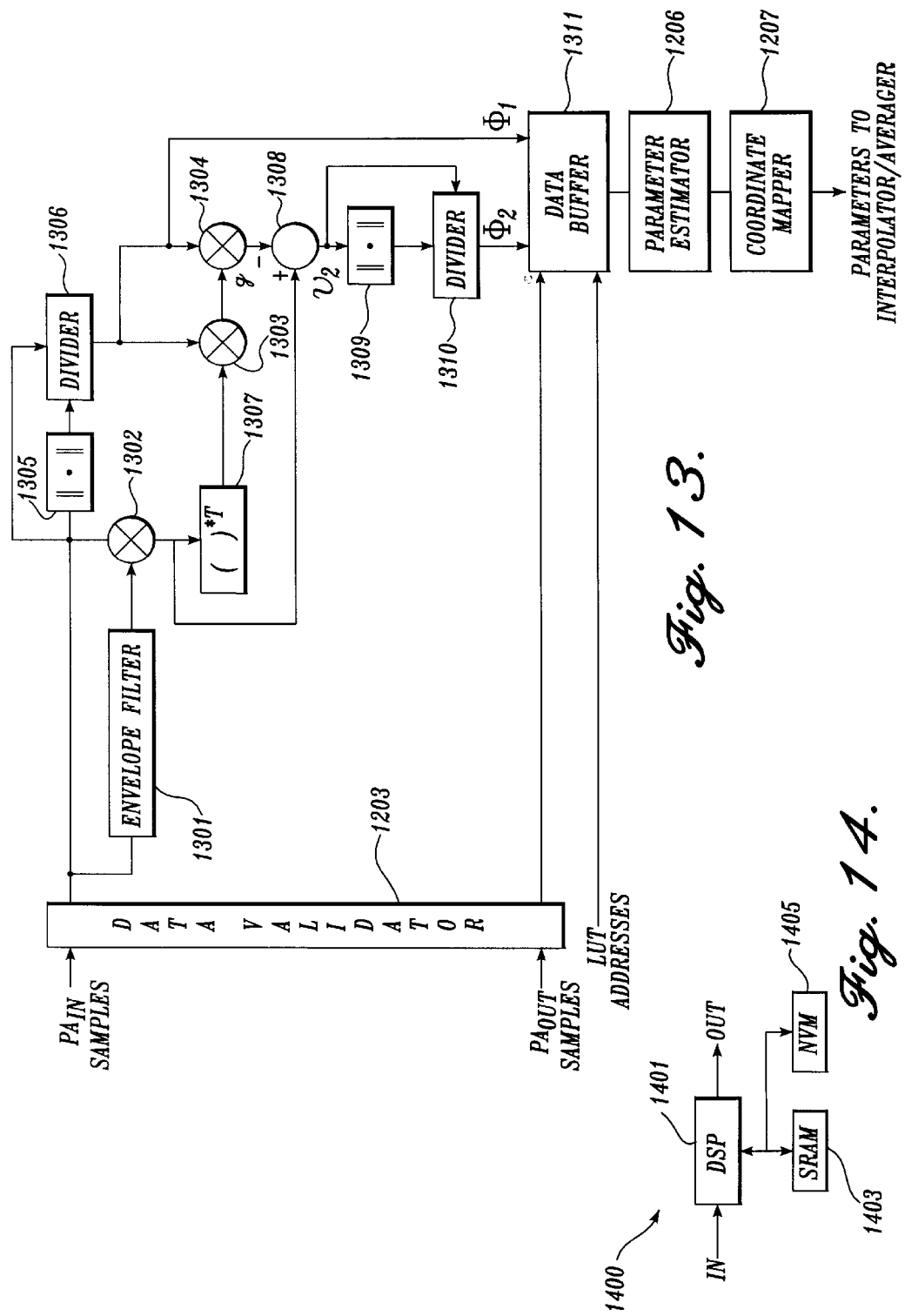

MODEL-BASED ADAPTIVE FEEDFORWARD AMPLIFIER LINEARIZER

FIELD OF THE INVENTION

The present invention relates to linear transmitters and, more particularly, to feedforward linear transmitters.

BACKGROUND

Radio Frequency (RF) power amplifiers are used in a variety of communication and other applications. In practice, power amplifiers behave in a non-linear fashion, which tends to distort the power amplifier's output signal. This distortion can cause several problems. For example, the distortion may result in transmission of signals outside of the desired transmitter channel. In some applications, government regulations set limits to these spurious emissions. Thus, spurious emissions are undesirable. In addition, these spurious emissions represent wasted power that would be better used in transmitting the desired output signal in the desired channel. Still further, these distortions can affect the demodulation of the transmitted signal when received by the intended recipient of the transmission. Accordingly, power amplifier distortion is undesirable.

Methods for reducing this distortion, commonly referred to as "linearizing" the power amplifier include "feedforward" linearization methods. FIG. 1 is a simplified functional block diagram of a conventional feedforward system 100. Feedforward system 100 includes a power amplifier (PA) 101, which receives an analog input signal to be amplified. A delay circuit 103 receives a signal that, ideally, is identical to the analog input signal received by PA 101, which serves to delay the "identical" analog input signal to match as closely as possible the delay of PA 101. A splitter or coupler (not shown) are commonly used to provide this "identical" signal to delay circuit 103. The output signal of delay circuit 103 is then received by a summer or combiner 105. In addition, combiner 105 receives, through a splitter or coupler (not shown), a signal that is ideally an attenuated but identical version of the output signal of PA 101. Combiner 105 then subtracts the "identical" analog input signal from the attenuated PA output signal to generate an error signal. This error signal represents an attenuated version of the distortion in the output signal from PA 101.

The error signal is then received by a gain and phase adjuster (G/P) 107, which, ideally, amplifies and adjusts the phase of the error signal so as to match the distortion in the PA output signal. A combiner 109 is used to subtract the output signal from G/P 107 from the PA output signal, which is received from a second delay circuit 111 connected to receive the output signal of PA 101. Delay circuit 111 serves to delay the PA output signal so as to match as closely as possible the delay of G/P 107. Combiner 109, ideally, cancels the distortion in the PA output signal by subtracting the adjusted error signal from the PA output signal. The resulting signal is then broadcast through an antenna 120.

However, there are several shortcomings to conventional feedforward linearizers. For example, some feedforward linearizers are implemented using analog devices that are preset to provide a predetermined gain and phase adjustment to the error signal. Unfortunately, the distortion caused by the power amplifier generally changes over time due to temperature, age, power supply variations, etc., which cannot be compensated for by these "fixed" systems.

Other feedforward systems attempt to monitor the PA output signal and "adapt" the gain and phase adjustment of the feedforward error signal so as to minimize the error signal for a subsequent PA input signal. These conventional feedforward systems typically base the gain and phase adjustment of the error signal as a function of the instantaneous power or magnitude of the input signal to the power amplifier. Further, these types of systems tend to be systems that attempt to adjust G/P 107 using analog gain stages and phase shifters. These analog devices tend to be inaccurate and can "drift" over time.

Some adaptive feedforward systems use analog band-pass cross-correlation techniques to minimize the error signals in the system. However, analog band-pass cross-correlation techniques are sensitive to DC offset during the correlation process, resulting in poor linearization. In addition, analog band-pass cross-correlation techniques tend to have "masking" effects when correlating large signals with small signals.

To avoid problems associated with analog band-pass cross-correlation techniques, some adaptive feedforward systems use standard least mean squares minimization algorithms to minimize error signals in the system. These systems tend to require a large amount of data to get good results (i.e., slow convergence).

In view of the above shortcomings of conventional feedforward linearizers, there is a need for an adaptive feedforward linearizer that will compensate for power amplifier distortion more quickly and accurately than the conventional feedforward linearizers that are based on "real time" minimization and analog band-pass correlation techniques.

SUMMARY

In accordance with the present invention, a feedforward linearizer system for a power amplifier (PA) is provided. In one embodiment adapted for use with digital input data to be transmitted by a RF transmitter, the system includes a trainer, an amplitude and delay matcher (ADM) and two combiners. In accordance with one aspect of the present invention, the system also includes a forward model of the PA. The trainer monitors the input signals and the PA output signals to build and update the forward model of the PA and update the ADM. The forward model receives the input signals and generates modeled PA output signals, which are received by one of the combiners. The ADM also receives the input signals and then scales and delays the input signals to match the amplitude of the linearly amplified component of the PA output signal and also adjusts the delay caused by the PA and other processing elements in the system. The combiner then subtracts the ADM output signals from the corresponding modeled PA output signals to generate corresponding error signals. The error signals represent the distortion caused by the PA. The error signals are then subtracted from the PA output signals using the second combiner, thereby canceling out the distortion caused by the PA. The use of the forward model more accurately determines the distortion caused by the power amplifier because the forward model is adaptive and avoids the aforementioned problems of the analog band-pass cross-correlation techniques and the least mean squares error signal minimization techniques.

In accordance with a further aspect of the present invention, the forward model of the PA includes modeling memory effects of the PA. The PA distortion is a function of not only of the instantaneous magnitude (or power) of the input signal, but also of the magnitude or power of past input signals. Thus, by modeling memory effects of the PA distortion, the forward model is more accurate. As a result, the error signal is also more accurate, thereby allowing more accurate cancellation of the PA distortion.

In accordance with another aspect of the present invention, the trainer periodically updates the forward model and the ADM, allowing the computation of the forward model and adjustments of the ADM to be performed "off-line".

In accordance with yet another aspect of the present invention, the forward model of the power amplifier uses orthogonal training signals for building the forward model. The orthogonal training signals significantly improve feedforward performance by helping the trainer to compute more accurate parameters for modeling the PA.

In accordance with still another aspect of the present invention, the trainer uses a modified version of the PA output signal. The modified PA output signal has the in-band distortion removed from the PA output signal. As a result of this pre-conditioning of the PA output signal, significant reductions in the nonlinear distortion of the power amplifier can be achieved.

BRIEF DESCRIPTION OF THE DRAWINGS

FIG. 9 is a functional block diagram of an envelope filter, according to one embodiment of the present invention;

FIG. 9A is a functional block diagram of an envelope filter, according to a second embodiment of the present invention;

FIG. 10 is a functional block diagram of an envelope filter, according to a third embodiment of the present invention;

FIG. 10A is a functional block diagram of an envelope filter, according to a fourth embodiment of the present invention;

FIG. 13 is a functional block diagram of the solver depicted in the trainer of FIG. 12, according to one embodiment of the present invention;

FIG. 14 is a block diagram of a digital signal processing circuit for implementing a forward modeler and trainer, according to one embodiment of the present invention;

DETAILED DESCRIPTION

Figure 2:
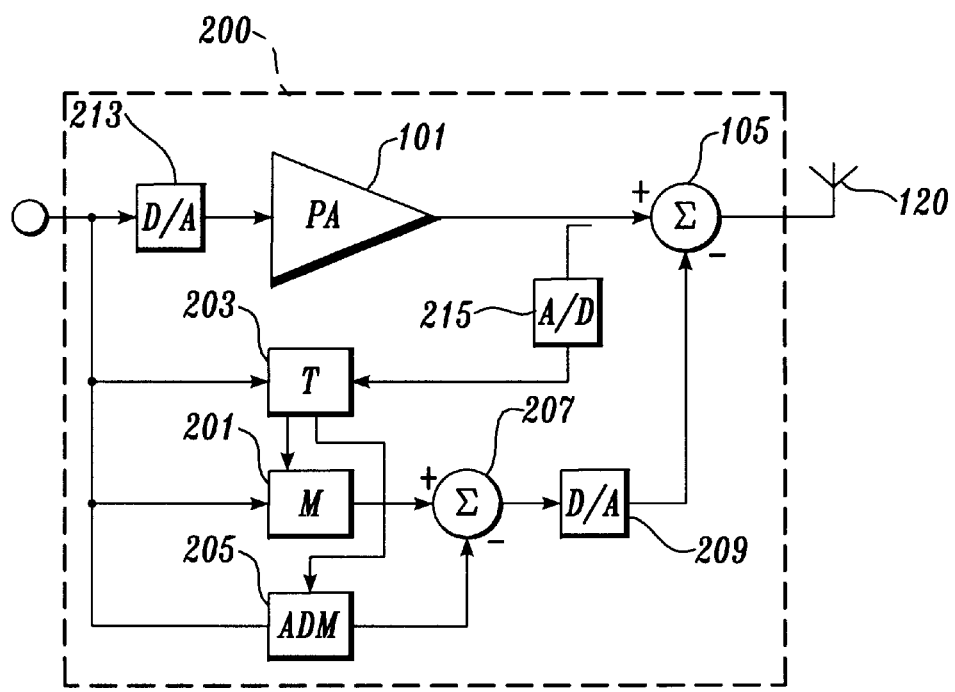
FIG. 2 is a simplified functional block diagram of a feedforward power amplifier linearization system, according to one embodiment of the present invention.

FIG. 2 is a simplified block diagram of a feedforward power amplifier (PA) linearizing system 200, according to one embodiment of the present invention. The feedforward system 200 includes a forward modeler 201, a trainer 203, an amplitude and delay matcher (ADM) 205, a summer or combiner 207, a digital-to-analog (D/A) converter 209, a D/A converter 213 and an analog-to-digital (A/D) converter 215, as well as PA 101, combiner 105 and antenna 120. For clarity, the same reference numbers are used between figures for elements having similar function.

System 200 is interconnected as follows. D/A converter 213 is connected to receive digital modulation signals from a conventional digital modulator (not shown). The output port of D/A converter 213 is connected to an input port of PA 101. A/D converter 215 has an input port connected to the output port of PA 101 and has an output port connected to an input port of trainer 203. Trainer 203 has another input port connected to received the same digital modulation signals received by D/A converter 213. Trainer 203 also has a first output port connected to forward modeler 201 and has a second output port connected to ADM 205.

Forward modeler 201 and ADM 205 each have an input port connected to receive the digital modulation signals and an output port connected to combiner 207. More specifically, the output port of forward modeler 201 is connected to a "positive" input port of combiner 207, whereas the output port of ADM 205 is connected to a "negative" input port of combiner 207. Combiner 207 has an output port connected to an input port of D/A converter 209. D/A converter 209 has an output port connected to a "negative" input port of combiner 105, which also has a "positive" input port connected to the output port of PA 101. Combiner 105 has an output port connected to antenna 120.

System 200 includes a feedforward branch and a training branch. The feedforward branch generates an error signal that is then combined with the PA output signal to cancel out distortion caused by PA 101. The training branch monitors the PA output signals and digital input signals to build and update forward modeler 201 and ADM 205.

The feedforward branch operates as follows. Forward modeler 201, trainer 203, ADM 205 and D/A converter 213 receive a digital signal representing a signal to be amplified by PA 101. In one embodiment, the digital signal is a sample of a modulated analog signal. This digital signal can be generated, for example, by a combination of A/D conversion, digital modulation and digital interpolation. Forward modeler 201 is a computed model of PA 101, configured to operate on the received digital signal to output a modeled PA output signal representative of the expected output signal of PA 101. In one embodiment, forward modeler 201 includes a lookup table (LUT) that is indexed by the digital signal to be amplified. One such embodiment is described in conjunction with FIG. 6 below.

Concurrently, ADM 205 adjusts or scales the amplitude of the received digital signal to match the amplitude of the linearly amplified component of the PA output signal from forward model 210. In addition, ADM 205 delays the scaled digital signal to match the delay of the forward modeler 201. A simple LUT, latch circuit (not shown) and conventional delay filter (not shown) may be used to implement ADM 205. ADM 205 is relatively simple in that ADM 205 operates in the digital domain. Consequently, the scaling process is easily and accurately performed without introducing errors, which could occur if analog amplifiers and phase shifters were used. Further, ADM 205 is easily updated to track changes in the gain of PA 101 by storing new values in the LUT.

Combiner 207 receives the output signals of forward modeler 201 and ADM 205. In one embodiment, combiner 207 is implemented using a digital adder that is configured to subtract the output signal of ADM 205 from the output signal of forward modeler 201 to generate an error signal representing the distortion caused by PA 101. In an alternative embodiment, a processor and associated memory (not shown) can be used to implement forward modeler 201, ADM 205 and combiner 207.

D/A converter 209 then receives the error signal generated by combiner 207 and outputs an analog signal corresponding to the received error signal. Combiner 105 then receives the analog error signal from D/A converter 209 and subtracts the analog error signal from the PA output signal from PA 101. In one embodiment, combiner 105 is implemented using a conventional directional coupler. Of course, any suitable combiner can be used in other embodiments. The output signal from combiner 105 is then broadcast through antenna 120.

The training branch operates to build and update forward modeler 201 and ADM 205 as follows. Trainer 201 receives the digital input signal and a digitized sample of the PA output signal corresponding to the digital input signal. In particular, a directional coupler provides a signal corresponding to the PA output signal to A/D converter 215. A/D converter 215 samples the signal from the directional coupler and generates a corresponding digital PA output signal. Trainer 203 then uses the digital input signal and corresponding digital PA output signal to compute a forward model of PA 101, as described below in conjunction with FIGS. 12–16.

Trainer 203 computes the forward model of PA 101 "off-line", which allows system 200 to train with minimal impact on the amplification and transmission of the data. After processing a batch of data, trainer 203 then updates forward modeler 201 and ADM 205 to account for any changes that may have occurred in the transfer characteristic of PA 101. By processing batches of data and periodically updating forward modeler 201 and ADM 205, trainer 203 allows system 200 to track variations in the behavior of PA 101 that can occur over time.

Figure 3:
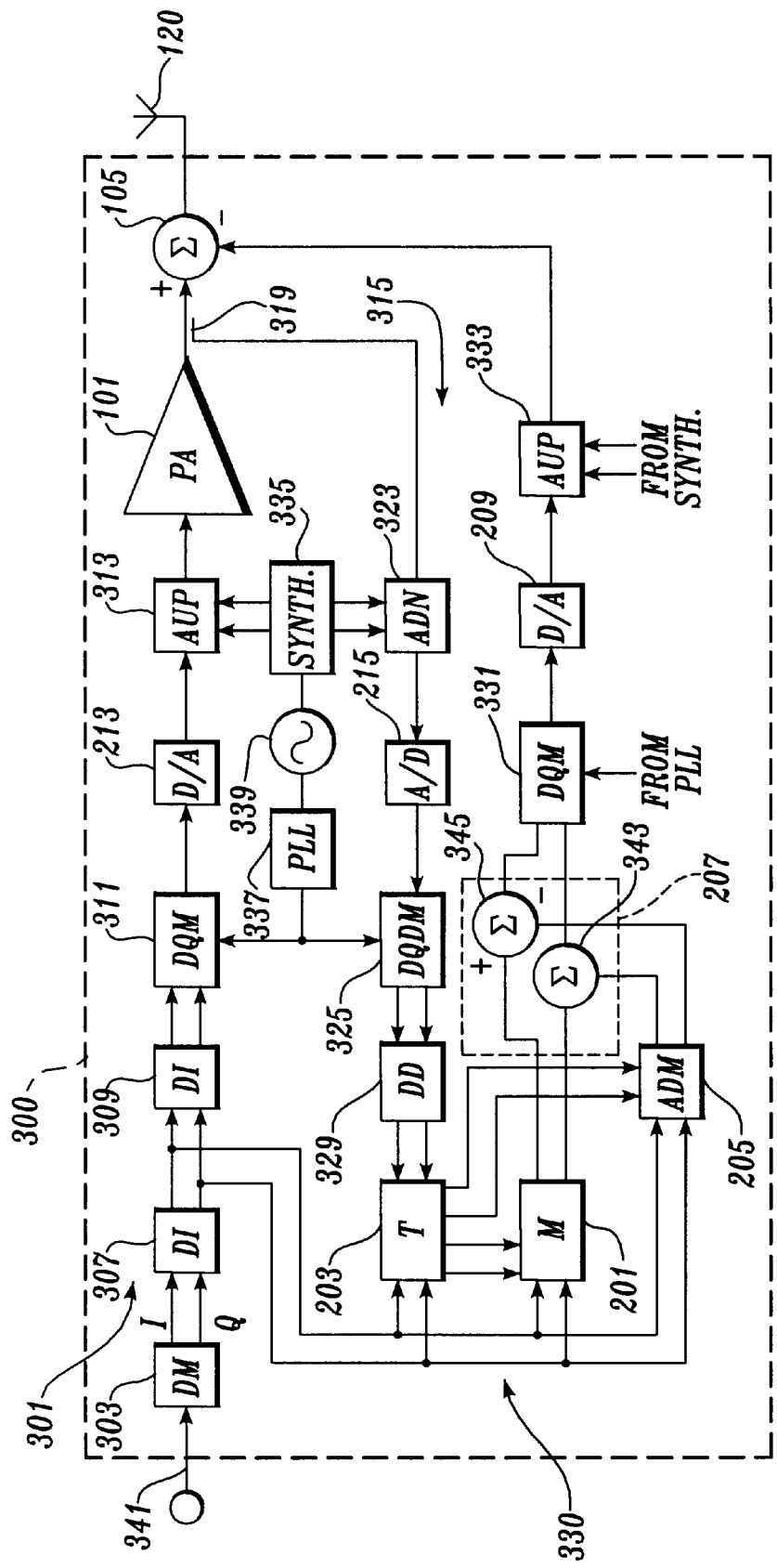
FIG. 3 is a functional block diagram of a feedforward power amplifier linearization system supporting digital quadrature modulation, according to one embodiment of the present invention.

FIG. 3 is a functional block diagram of a linear transmitter 300 using a feedforward system according to one embodiment of the present invention. Transmitter 300 is similar to system 200 (FIG. 2) except that transmitter 300 includes elements to support modulation, training and forward modeling in baseband, with elements to support upconversion to transmission frequencies. Further, the circuitry supporting modulation and training in baseband and upconversion to transmission frequencies is substantially similar to corresponding circuitry in a predistortion transmitter described in co-pending U.S. patent application Ser. No. 08/965,097 entitled "Predistortion In A Linear Transmitter Using Orthogonal Kernels", which is assigned to the same assignee of the present invention and incorporated herein by reference. Of course, in the present invention, a feedforward linearization system is used instead of the predistortion system in the aforementioned Ser. No. 08/965,097 application. In a preferred embodiment, linear transmitter 300 is adapted for use as a paging transmitter in a paging system. Of course, in other embodiments, linear transmitter 300 can be used in other radio frequency (RF) applications.

Transmitter 300, in a forward signal processing path 301, includes a digital modulator 303, a digital interpolator 307, a digital quadrature modulator 311, D/A converter 213, an analog upconverter 313, PA 101 and antenna 120. A feedback loop 315 of transmitter 300 includes a coupler 319 (between PA 101 and antenna 120), an analog downconverter 323, A/D converter 215, a digital quadrature demodulator 325, a digital decimator 329 and trainer 203. In addition, transmitter 300, in a feedforward signal processing path 330, includes forward modeler 201, ADM 205, coupler 207, a digital quadrature demodulator 331, D/A converter 209 and an analog upconverter 333. Trainer 203 is coupled to receive the output signals of digital interpolator 307 and the output signals of digital quadrature demodulator 325. In other embodiments, additional power amplifiers may be connected in parallel with PA 101 to increase the gain of transmitter 300.

Digital data that is to be broadcast by transmitter 300 is provided to digital modulator 303, as represented by an arrow 341. The digital data may be provided by any source. In a preferred embodiment, the digital data received by digital modulator 303 is provided from a transmitter controller (not shown) of the paging system. The transmitter controller receives data over a link channel from a paging terminal and formulates the data for transmission. The details of the construction of a transmitter controller, and indeed an entire paging system, can be found in U.S. Pat. No. 5,481,258 to Fawcett et al., U.S. Pat. No. 5,365,569 to Witsaman et al. and U.S. Pat. No. 5,416,808 to Witsaman et al., commonly assigned to the assignee of the present invention and incorporated herein by reference.

In a preferred embodiment, the data is a series of digital symbols, with each symbol representing a predetermined number of bits. The number of bits per symbol is dependent upon the particular modulation scheme being transmitted by transmitter 300. Modulation formats in typical conventional paging data systems include, for example, two or four tone frequency shift keying (FSK) modulation, continuous phase FSK (CPFSK), 43K75B8E formal modulation (a type of amplitude modulation developed by Motorola, Inc., Schaumburg, Ill.) and quadrature amplitude modulation (QAM). QAM formats include, for example, an eight level QAM scheme that would have a three-bit symbol. Similarly, a sixteen level QAM scheme would have four bits per symbol. It will be appreciated that for a three-bit symbol, there are eight possible symbols. Likewise, for a four-bit symbol, there are sixteen possible symbols.

Digital modulator 303 maps each particular symbol into predetermined in-phase and quadrature output signals. Thus, for each unique symbol, a different combination of in-phase and quadrature component signals for the base band signal is output by digital modulator 303. In one embodiment, digital modulator 303 includes a Texas Instruments TMS320C44 digital signal processor (DSP) microprocessor that is programmed to perform the in-phase and quadrature modulation on the symbols.

Additionally, as each symbol is processed, digital modulator 303 does not "instantaneously" transition from one symbol to another. Such an instantaneous change in in-phase and quadrature output signals would result in high frequency harmonics in the system. Instead, by means of digital filtering, a smooth transition between symbols (and therefore in-phase and quadrature output signals) is achieved. One embodiment of this technique which is applicable to an FSK system is disclosed in more detail in U.S. Pat. No. 5,418,818 to Marchetto et al., assigned to the same assignee as the present invention and incorporated herein by reference.

Next, the in-phase and quadrature component signals generated by digital modulator 303 are input into cascaded digital interpolators 307 and 309, which are configured to provide additional signal samples by interpolating between actual modulation signal samples. Consequently, digital interpolators 307 and 309, in effect, increase the modulation signal sampling rate to improve trainer performance and aid in upconversion.

The output signals of digital interpolator 309 are then provided to digital quadrature modulator 311. Digital quadrature modulator 311 converts the in-phase and quadrature component signals into a single real digital signal. The real digital signal from digital quadrature modulator 311 is received by D/A converter 213, which converts the real digital signal to an analog signal, producing an intermediate frequency output signal. For example, the intermediate frequency is approximately 5.6 MHz in a representative embodiment. Because a single D/A converter is used in this signal processing path, the distortion caused by the relative delay and amplitude differences introduced in those conventional systems that use separate D/A converters for in-phase and quadrature signals is substantially eliminated in transmitter 300.

The intermediate frequency output signal from D/A converter 213 is provided to analog upconverter 313, which converts the intermediate frequency signal to a broadcast frequency signal having a frequency within a frequency band of the paging system. For example, the broadcast frequency is approximately 940 MHz in a representative embodiment. Analog upconverter 313 can be any suitable conventional upconverter such as, for example, a mixer receiving a local oscillator signal.

PA 101 receives the broadcast frequency signal from analog upconverter 313, amplifies the signal, and provides the amplified signal to antenna 120 for transmission. In one embodiment, PA 101 is substantially similar to the power amplifier disclosed in U.S. application Ser. No. 08/601,370 entitled "High-Power Amplifier Using Parallel Transistors", assigned to the same assignee as the present invention and incorporated herein by reference. Of course, any suitable power amplifier can be used in other embodiments.

In order to aid in the accurate computation of forward modeler 201, feedback loop 315 is used to monitor the amplified signal from PA 101. Coupler 319 is a conventional directional coupler positioned relatively close to antenna 120 and is operative to direct a relatively small portion of the output signal from PA 101 to analog downconverter 323.

Analog downconverter 323 operates in an opposite manner to analog upconverter 313. In particular, analog downconverter 323 lowers the frequency of the "receive signal" from coupler 319 to an intermediate frequency. In a preferred embodiment, this intermediate frequency is substantially the same as the intermediate frequency used in the forward signal processing path. Within analog downconverter 323, there is a series of processes (e.g., filtering, amplification, and mixing with local oscillator signals) to generate the intermediate frequency signal, as described in the aforementioned Ser. No. 08/601,118 patent application.

Next, the intermediate frequency signal is converted from an analog intermediate frequency signal into a digital signal. This is accomplished by using A/D converter 215, which is a conventional A/D converter such as, for example, an Analog Devices AD9026. A/D converter 215 samples the intermediate frequency signal and outputs a digital signal representing the sampled intermediate frequency signal. Digital quadrature demodulator 325 performs a digital quadrature demodulation of the digital signals and outputs the in-phase component signal and the quadrature component signal.

Trainer 203 receives the output signals from digital quadrature demodulator 325 and the output signals from digital modulator 303. Trainer 203 then computes a forward model of PA 101, as described below in conjunction with FIGS. 12–16. Thus, ideally, trainer 203 receives the equivalent of the exact modulated signal that was intended to be sent (the output signals of digital modulator 303) and the signal that was actually transmitted (the output signals of the digital quadrature demodulator 325). This scheme enables trainer 203 to associate the distorted output sample to its corresponding input sample so that trainer 203 can more accurately model the distortion caused by PA 101. Trainer 203 then periodically provides one or more "trainer" signals to forward modeler 201 to update forward modeler 201 so as to track changes in the transfer characteristic of PA 101 that occur over time due to temperature, age, power supply fluctuations, etc.

In addition, in this scheme, trainer 203 monitors the actual data or voice signals being transmitted to implement the feedforward scheme, as opposed to special sequences or pilot signals (i.e., not normal data or voice signals) as required by some conventional systems. Thus, normal data or voice transmissions need not be interrupted to transmit special data sequences to update the predistorter as in these conventional systems, nor is any of the channel bandwidth "wasted" on transmitting a pilot signal.

Transmitter 300 also includes a synthesizer 335, a phase locked loop (PLL) 337 and an ovenized reference oscillator 339 to generate synchronized timing signals. Synthesizer 335 is connected to analog upconverter 313, analog downconverter 323 and analog upconverter 333. PLL 337 is connected to digital quadrature modulator 311, digital quadrature demodulator 325 and digital quadrature modulator 331. Ovenized reference oscillator 339 is connected to both synthesizer 335 and PLL 337. This timing circuitry ensures that the quadrature modulation, upconversion, downconversion and quadrature demodulation processes are accurately synchronized with each other on a sample-by-sample basis.

In one embodiment, the output signals of digital modulator 303 are the in-phase and quadrature component signals sampled at 80,000 samples per second (80 ksps). The in-phase and quadrature component signals output by digital modulator 303 are received by digital interpolator 307. As described above, digital interpolator 305 operates to increase the effective sampling rate of the received signals by means of digital interpolation. In a preferred embodiment, digital interpolator 305 outputs the in-phase and quadrature component signals at a rate of approximately 800 ksps and is implemented with a DSP module having a TMS320C44 DSP microprocessor and associated memory, as described below in conjunction with FIG. 14.

Digital interpolator 309 operates in a fashion similar to digital interpolator 307 to increase the effective sampling rate. Specifically, both the in-phase and quadrature component signals are first upconverted in a first step by a factor of two. Thus, after this first conversion, the effective sampling rate of the component signals is approximately 1.6 Msps. The signals are then upconverted by another factor of two, resulting in an effective rate of approximately 3.2 Msps. Next, these two 3.2 Msps signals are passed to a further interpolator which upconverts them by a factor of seven to approximately 22.4 Msps. Thus, the output signals of the digital interpolator 309 are in-phase and quadrature component signals that have been sampled at 22.4 Msps. The interpolation stages include digital filtering of the base band signals. The implementation of digital interpolator 309 is described in more detail in the aforementioned Ser. No. 08/601,118 patent application.

Digital quadrature modulator 311 receives the output signals of digital interpolator 309 and modulates them as previously described using a digital quadrature modulation scheme. In this embodiment, digital quadrature modulator 311 uses a digital equivalent of a conventional double balanced modulation scheme in conjunction with a 5.6 MHz carrier signal derived from a 22.4 MHz signal provided by PLL 337. The real digital modulated output signal is then converted to an analog signal by D/A converter 213. As a result, D/A converter 213 outputs a 5.6 MHz analog intermediate frequency signal to analog upconverter 313.

Analog upconverter 313 receives two local oscillator signals provided by synthesizer 335. In a preferred embodiment in which the broadcast frequency is 940 MHz, the two frequencies provided by synthesizer 335 are a 36.9 MHz local oscillator signal and a 897.5 MHz local oscillator signal. Analog upconverter 313 receives the local oscillator signals for mixing with the 5.6 MHz intermediate frequency signal in a conventional two-stage mixing scheme. In the first stage of the upconversion, the intermediate signal is mixed with the 36.9 MHz local oscillator signal, and the upper side band of the resulting 42.5 MHz signal is amplified and bandpass filtered before being mixed with the 897.5 MHz local oscillator signal. The resulting upper side band at 940 MHz is bandpass filtered and provided to PA 101. It will be appreciated by those skilled in the art of linear RF transmitters that to change the frequency of transmission of transmitter 300, the local oscillator frequencies generated by synthesizer 335 can be changed. The 940 MHz signal is then amplified by PA 101 and broadcast through antenna 120 as previously described.

In a preferred embodiment, synthesizer 335 is a Phillips SA7025 synthesizer chip. As noted above, synthesizer 335 controls the variable local oscillator signal for precisely determining the transmit frequency of the signal. Synthesizer 335 receives a reference oscillator signal from reference oscillator 339 that, in a preferred embodiment, provides a stable 10 MHz reference signal. In this preferred embodiment, this 10 MHz stable reference signal is obtained from the transmitter controller of a paging base station (not shown).

The 940 MHz receive signal from coupler 319 is provided to analog downconverter 323, converted to the intermediate frequency of 5.6 MHz, and digitized by A/D converter 215. The digital signals from A/D converter 215 are then received by digital quadrature demodulator 325. Digital quadrature demodulator 325 operates to generate in-phase and quadrature component signals at 22.4 Msps. In a preferred embodiment, digital quadrature demodulator 325 is implemented using a Xilinx 4003 field programmable gate array (FPGA) that has been configured to perform the digital quadrature demodulation.

Digital decimator 329 receives the output signals of digital quadrature demodulator 325 and performs a decimation by a factor of twenty-eight to produce 800 ksps complex base band signals. The downconversion is performed, in a preferred embodiment, by two Harris HSP43220 decimating filter chips programmed to decimate by twenty-eight and to filter the base band signals.

The 800 ksps complex base band signals are received by trainer 203. As previously described, trainer 203 analyzes the receive signals and the signals from digital interpolator 307 to compute a forward model of PA 101.

In feedforward path 330, forward modeler 201 receives the digital signals sampled at 800 ksps from digital interpolator 307. As described above in conjunction with FIG. 2, forward model then generates digital output signals representing the output signals of PA 101. Concurrently, ADM 205 receives the digital signals from digital modulator 303 and adjusts the amplitude of the digital signals to match the expected amplitude of the linearly amplified component of the corresponding PA output signal from PA 101. ADM 205 also matches the delay of PA 101 and intervening circuitry. Combiner 207 then subtracts the digital output signals from ADM 205 from the corresponding digital signals from forward modeler 201. In this embodiment, combiner 207 is implemented with conventional adders 343 and 345. The output signals from combiner 207 represent the error signals caused by the distortion of PA 101. The error signals are then provided to combiner 105 through modulation and upconversion processing circuitry implemented by digital quadrature modulator 331, D/A converter 209 and analog upconverter 333. Digital quadrature modulator 331, D/A converter 209 and analog upconverter 333 are implemented in the same manner and function in same manner as described above for digital quadrature modulator 311, D/A converter 213 and analog upconverter 313 in forward processing path 301. This processing allows the error signal from combiner 207 to be properly combined with the PA output signal from PA 101. Combiner 105 then subtracts the analog upconverted error signal from the PA output signal, thereby reducing the distortion caused by PA 101 during the amplification process. The output signal from combiner 105 is then transmitted to the desired recipient via antenna 120.

An important feature of the present invention is that all of the processing done by each of the components of transmitter 300 is keyed off synchronous clock signals. By utilizing the same clocking in the demodulation scheme of feedback loop 315 as is used in the modulation schemes of forward signal processing branch 301 and feedforward branch 330, it is possible to monitor the transmitted signal quality on each digital sample. The modulation and demodulation are phase locked to one another with adjustment only needed for the delay through the analog and digital stages, including PA 101. This delay is provided by ADM 205. In one embodiment, trainer 203, using well-known techniques, is configured to estimate the delay through the power amplifier and intervening circuitry and generate parameters for updating a digital delay filter implemented in ADM 205.

The above-described embodiment trains the forward model using the digital signals generated by digital interpolator 307. However, in an alternative embodiment (not shown), system 200 may be modified to train on the interpolated digital signals from digital interpolator 309. In this embodiment, trainer 203, forward modeler 201 and ADM 205 would be connected to receive the output signals from digital interpolator 309. Likewise, digital decimator 329 may be deleted if A/D converter 215 and digital quadrature demodulator 325 operate to output digital signals to trainer 203 at an effective sampling rate equivalent to the effective sampling rate of the output signals of digital interpolator 309. Digital decimator 329 may be left in the system to equalize the effective sampling rates if digital quadrature demodulator 325 outputs signals that have a higher effective sampling rate that digital interpolator 309. These alternative embodiments would be expected to increase the accuracy of the forward modeling process, but would require more processing.

Figure 4:
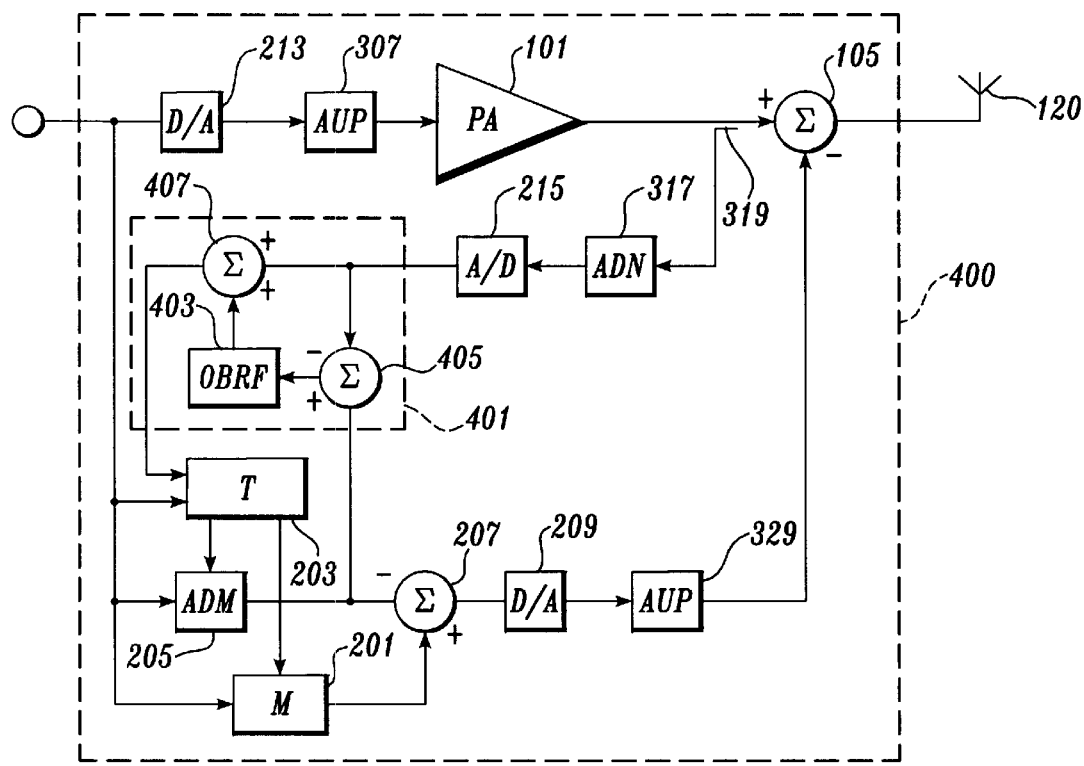
FIG. 4 is a functional block diagram of a feedforward power amplifier linearization system with out-of-band rejection filter, according to one embodiment of the present invention.

FIG. 4 is a functional block diagram of a feedforward system 400 according to one embodiment of the present invention. System 400 is substantially similar to system 200 (FIG. 2) except that system 400 includes a frequency selectivity circuit 401 connected between A/D converter 215 and trainer 203 to improve training performance as described below. In addition, some intervening circuitry shown in FIG. 2 has been omitted in FIG. 4 for clarity. Consequently, except as noted below, system 400 operates in substantially the same manner as described above for system 200 (FIG. 2).

Intermodulation products and other distortion (collectively known as "distortion") have been observed in the desired broadcast RF channel (referred to as "in-band"), which adversely affects the training of forward modeler 201. The in-band distortion is not only generated by the non-linearity of PA 101, but also from other low frequency sources that are not necessarily from PA 101. Sources of these non-power amplifier distortions may include any combination of dynamic power supply effects including ripple and transient noise. In addition, bias irregularities on the power amplifier's transistors and thermal transients can introduce low frequency (in-band) effects that are not a reproducible part of the distortion and which is not helpful to model.

Further, the low frequency distortions appear close to the center of the band when upconverted to the power amplifier output frequency. Because these distortions are not due to PA 101, modeling of these distortions in forward modeler 201 may hinder linearization. Thus, in system 400, frequency selectivity circuit 401 solves this problem by removing the in-band distortion from the PA output signal that is used by trainer 203.

Frequency selectivity circuit 401 includes a out-of-band-rejection filter (OBRF) 403, a first summer 405 and a second summer 407. In operation, first summer 405 receives a scaled modulated digital input signal from ADM 205 and the corresponding digitized receive signal from A/D converter 215. First summer 1016 subtracts the digitized receive signal of from the modulated digital input signal to form an error signal (different from the error signal generated by combiner 207). Because the digitized receive signal (derived from the output signal of the PA 101) is subtracted from the output signal from ADM 205, the error signal represents the negative of the distortion caused by PA 101.

The second error signal is provided to OBRF 403. In a preferred embodiment, OBRF 403 is implemented with a conventional low-pass filter having a cutoff frequency of about 24 kHz. However, in light of the present disclosure, it will be appreciated by those skilled in the art of linear transmitters that the cutoff frequency may be adjusted depending upon the bandwidth of the desired broadcast RF channel. OBRF 403 is operative to remove that part of the error signal that is outside of the desired broadcast RF channel (referred to as "out-of-band"). The output signal of OBRF 403 is referred to as the in-band error signal. The in-band error signal generated by OBRF 403 is the negative of the in-band distortion caused by PA 101.

The in-band error signal is then added to the output signal of the A/D converter 215 at second summer 407. As a result, second summer 407 subtracts the in-band distortion from the output signal of the A/D converter 407. The output signal of second summer 407 is referred to herein as the modified PA output signal. The modified PA output signal is then used by trainer 203 (as discussed above) to calculate the values for forward modeler 201. Thus, in system 400, the modified PA output signals are used by trainer 203 instead of output signals of A/D converter 215 as in system 200 (FIG. 2), thereby avoiding the problem of training on in-band distortion from PA 101.

Figure 5:
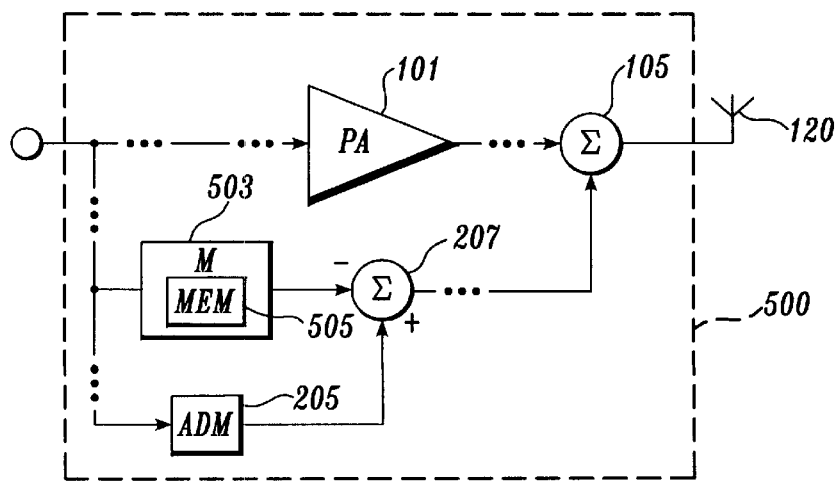
FIG. 5 is a simplified functional block diagram of a feedforward power amplifier linearization system with a memory effect modeler, according to one embodiment of the present invention.

FIG. 5 is a functional block diagram of a feedforward system 500 according to another embodiment of the present invention. System 500 is substantially similar to system 200 (FIG. 2) except that in system 500, forward modeler 201 is replaced with a forward modeler 503. In addition, some intervening circuitry shown in FIG. 2 has been omitted in FIG. 5 for clarity. Consequently, except as noted below, system 500 operates in the same manner as described above for system 200 (FIG. 2). Forward modeler 503 differs from forward modeler 201 in that forward modeler 503 includes a memory effect modeler 505 (described further below in conjunction with FIGS. 6–8).

Figure 1:
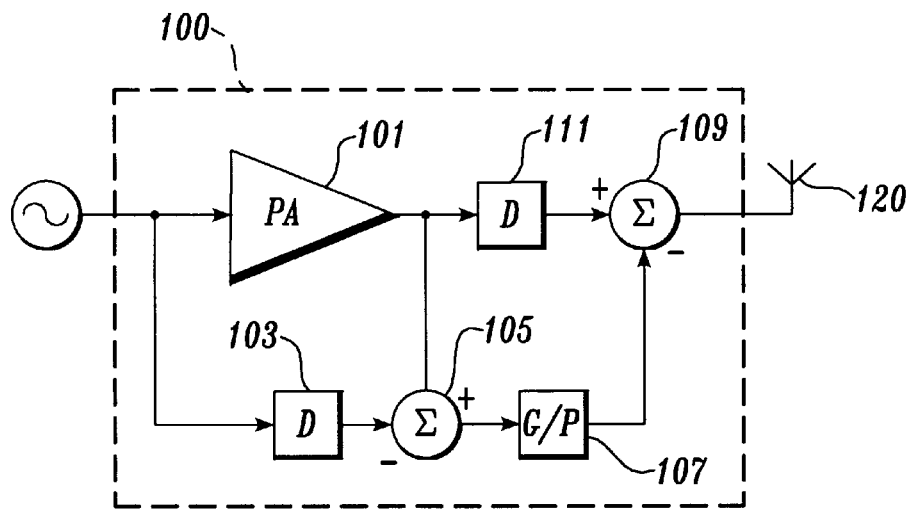
FIG. 1 is a simplified functional block diagram of a conventional feedforward system.

As described above in conjunction with FIG. 1, the gain and phase adjuster of a conventional feedforward system receives the error signals. In particular, this type of conventional gain and phase adjuster is adjusted to respond to the instantaneous power or magnitude envelope of the current input signal, with the feedforward signal being determined as a function of this instantaneous value. However, unlike other feedforward systems, the memory effect modeler 505 of forward modeler 503 takes into account the power or magnitude envelope of one or more previous signals.

More specifically, as is disclosed in the aforementioned Ser. No. 08/965,097 application, modeling the power amplifier transfer characteristic using only the instantaneous power or magnitude does not completely accurately predict the power amplifier's distortion. Further, the power amplifier's transfer characteristic also depends on past power or magnitude envelopes, which is referred to herein as a "memory effect" of the power amplifier. The memory effect of the power amplifier is related to the power or magnitude trajectory of the previous power or magnitude envelopes leading to the instantaneous power or magnitude envelope of the current signal. Applicant believes that in conventional feedforward linearizers, the memory effect is not accounted for, thereby resulting in errors in linearization. By modeling the power amplifier transfer characteristic as a function of both the instantaneous power or magnitude envelope and past power or magnitude envelopes, the accuracy of the forward model of the power amplifier can be improved, resulting in a more accurate feedforward linearization scheme. Implementations of forward modeler 503 with memory effect modeler 505 are described below in conjunction with FIGS. 7 and 8.

Feedforward system 500 operates as follows. Forward modeler 503 receives the digital signals to be amplified by PA 101. PA 101 also receives the digital signals after being converted to analog form and upconverted as described above in conjunction with FIG. 2. Forward modeler 503, using memory effect modeler 505, operates on the received digital signals to generate modeled PA output signals as a function of both the instantaneous power or magnitude envelope and past power or magnitude envelopes. The modeled PA output signals from forward modeler 503 represent the PA output signals generated by PA 101. As described above, by modeling PA 101 as a function of both instantaneous and past magnitude (or power) envelopes, a more accurate prediction of the PA output signals is achieved.

The modeled PA output signals are received by combiner 207. Then, as described above for system 200 (FIG. 2), combiner 207 subtracts the output signals from ADM 205 to form the error signal, which is then provided to combiner 105 after being appropriately converted to analog form and upconverted. The output signals from combiner 105 are then transmitted through antenna 120 to the desired recipient.

Figure 6:
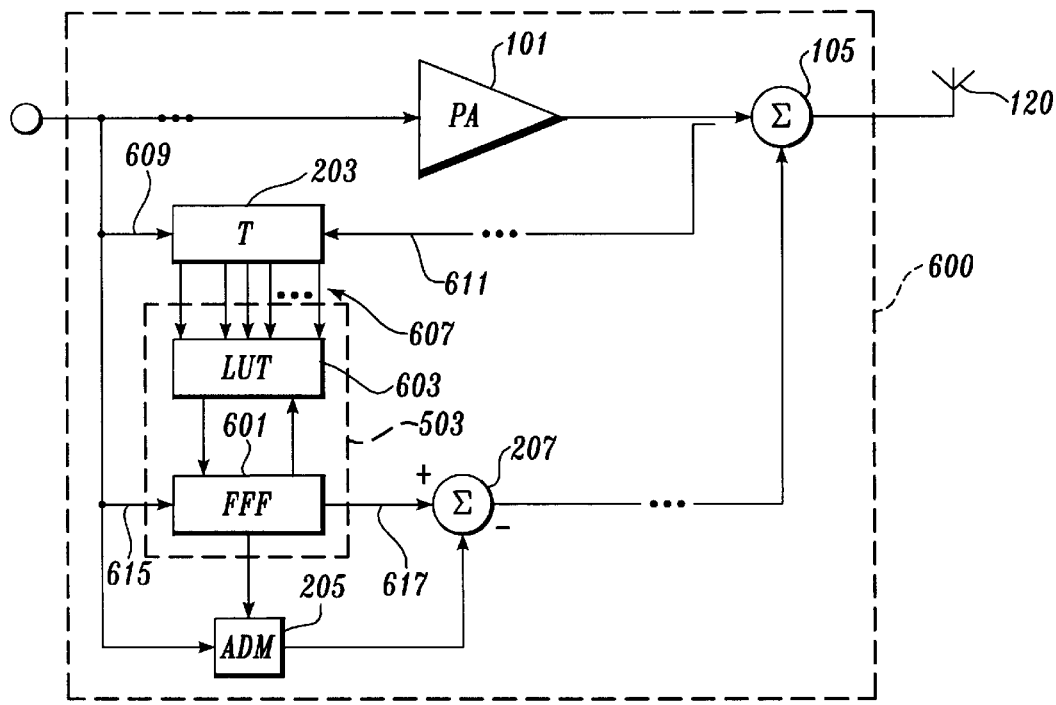
FIG. 6 is a functional block diagram of a feedforward power amplifier linearization system using a lookup table, according to one embodiment of the present invention.

FIG. 6 is a functional block diagram of feedforward system 600 according to one embodiment of the present invention. Feedforward system 600 is substantially similar to feedforward system 500 (FIG. 5), with forward modeler 503 of this embodiment being implemented with a feedforward filter 601 and a LUT 603. Feedforward filter 601 is implemented using a digital filter circuit with the filter coefficients or taps of the digital filter circuit being stored in LUT 603. One implementation of feedforward filter 601 is described in conjunction with FIG. 7 below. Feedforward filter 601 provides the forward model functionality as a function of both the instantaneous power or magnitude envelope of the current modulation signal sample and the power or magnitude envelopes of previous modulation signal samples.

Trainer 203 periodically updates the forward characteristics of PA 101 by providing a write address and updated filter coefficients to LUT 603, as shown by the lines 607. In addition, trainer 203 periodically receives "batches" of data containing the modulation signal samples and PA output signal samples (after appropriate digitizing and downconversion) as indicated by lines 609 and 611, respectively. Trainer 203 provides the forward characteristics of PA 101 to LUT 603 as described below in conjunction with FIGS. 12–16. Trainer 203 "qualifies" the data so that trainer 203 only trains on valid data. This qualifying process is described below in conjunction with FIGS. 13 and 15–16. Trainer 203 then updates LUT 603 with qualifying filter coefficients to accurately model the forward transfer characteristic of PA 101.

Figure 7:
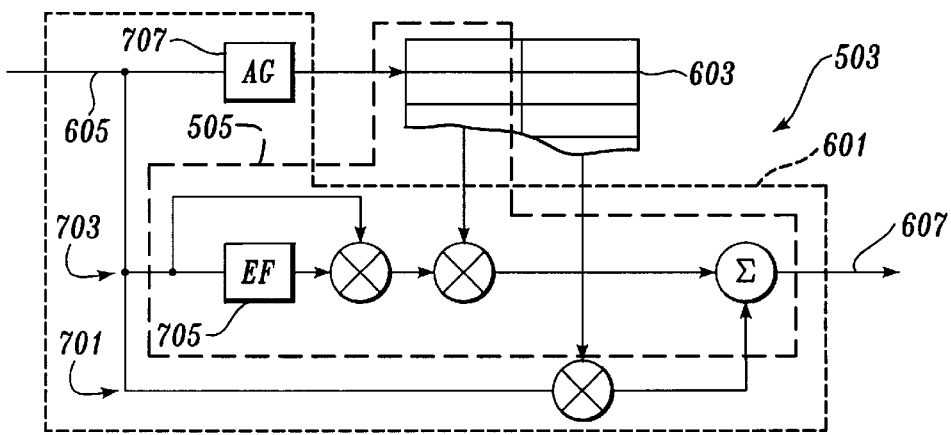
FIG. 7 is a functional block diagram of a forward model of a PA with a memory effect modeler, according to one embodiment of the present invention.

FIG. 7 is a functional block diagram of feedforward filter 601 according to one embodiment of the present invention. Feedforward filter 601 includes a complex gain (or static) branch 701, and a parallel weighted branch 703 that implements the functionality of memory effect modeler 505 (FIG. 5). The output signals of these branches are then summed to produce the filter output signal. This filter output signal is the modeled PA output signal serving as a basis for generating the feedforward error signal to be combined with the PA output signal from PA 101. Because the filter output signal is digital, the filter output signals are also referred to herein as the filter output samples. In this embodiment, feedforward filter 601 is implemented with a TMS320C44 DSP microprocessor and associated memory (not shown) using techniques well known in the art of digital linear transmitters. Feedforward filter 601 also includes an address generator 707 that is used to generate the read addresses to access LUT 603. Address generator 707 is described below in conjunction with FIG. 11.

Static branch 701 multiplies the modulation signal sample by a complex parameter from LUT 603. Address generator 707 uses the instantaneous power or magnitude envelope of the current modulation signal sample to generate the address of this complex parameter. The complex parameter represents part of the forward transfer characteristic to be multiplied with the current modulation signal sample.

Weighted branch 703 includes an envelope filter 705 that generates weighted values as a function of previous power or magnitude envelope samples. Envelope filter 705 is described further below in conjunction with FIGS. 9 and 10. In this embodiment, envelope filter 705 generates the weighted values as a function of the current and the previous modulation signal sample, using a first order digital filter to model the memory effects of the power amplifier. The scalar weighted values are then multiplied by the complex input samples. The resulting signal is multiplied by the complex parameters stored in LUT 603. In this embodiment, LUT 603 is indexed by the instantaneous power or, alternatively, the instantaneous magnitude of the modulation samples to provide the appropriate complex parameter for weighted branch 703, which is calculated by address generator 707. This first order modeling of the memory effect is relatively simple to implement while achieving accuracy which is significantly better than from complex gain alone. In other embodiments, higher order digital filters may be used to model the memory effects of PA 101. In addition, in other embodiments, LUT 603 may include additional dimensions or tables that are indexed by other pertinent parameters. For example, LUTs may be addressed by both instantaneous power or magnitude and also by an average of envelope power or magnitude of previous samples. In addition, different tables may be used for different modulation schemes or during ramp up or ramp down of power to the power amplifier.

Figure 8:
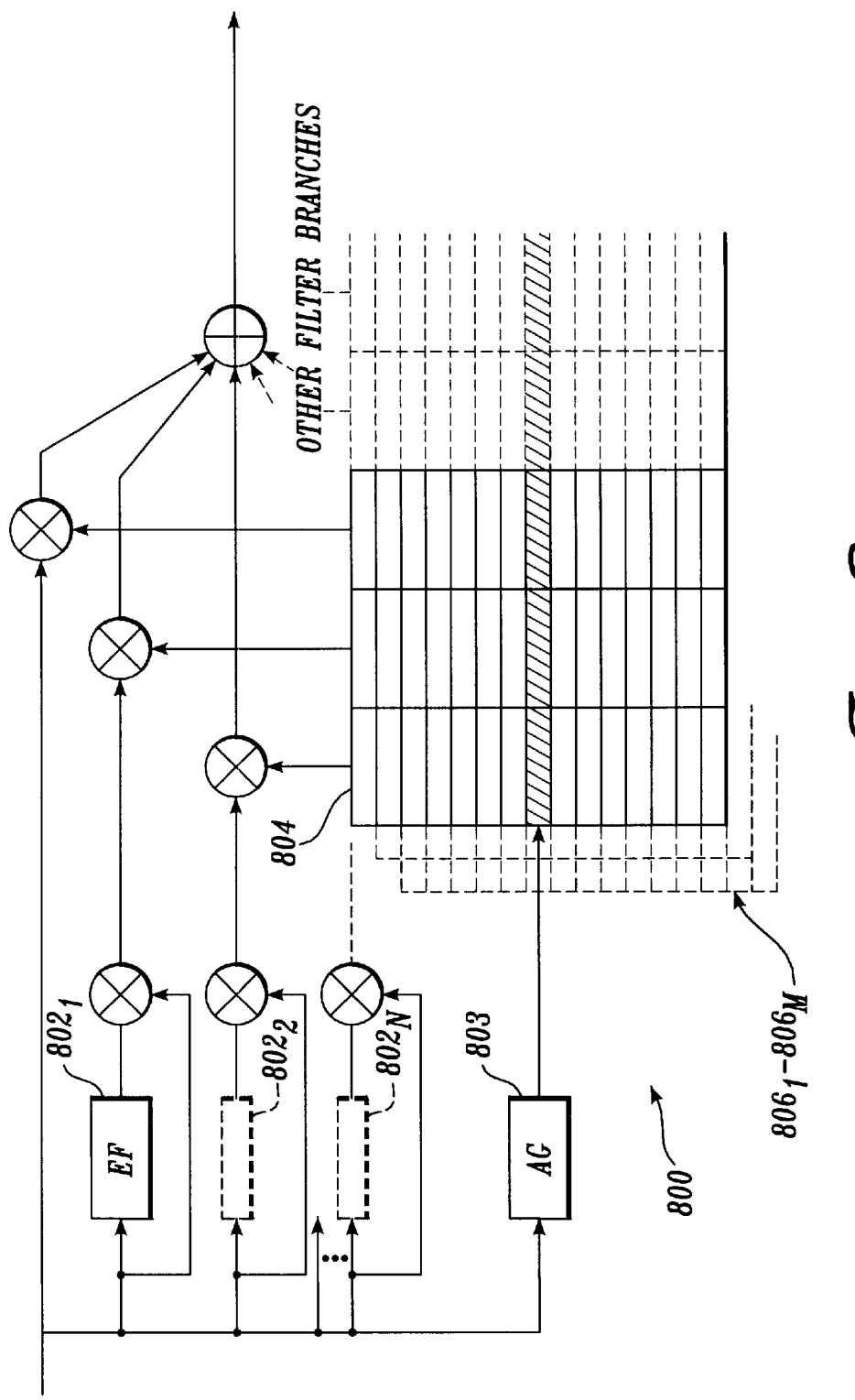
FIG. 8 is a functional block diagram of a forward model of a PA with a memory effect modeler, according to a second embodiment of the present invention.

FIG. 8 is a functional block diagram of a feedforward filter 800 having additional indexes compared to the feedforward filter 601 (FIG. 7), according to another embodiment of the present invention. In this embodiment, feedforward filter 800 has multiple envelope filters $802_1$–$802_N$, an address generator 803 and a LUT 804. LUT 804 has a column associated with each envelope filter, each column being indexed by address generator 803 as a function of the instantaneous power or magnitude envelope of the current modulation signal sample and power or magnitude envelopes of past modulation signal samples. Address generator 803 is described further below in conjunction with FIG. 11.

In addition, optional LUTs $806_1$–$806_M$ can be included to implement a multitable feedforward filter as described above in conjunction with FIG. 7. Feedforward filter 800 operates in a substantially similar manner as feedforward filter 601 (FIG. 7), with the additional envelope filters providing additional weighted branches to account for other memory effects. For example, envelope filters $802_1$–$802_N$ may correspond to actual past power or magnitude envelope samples rather than the average of past power or magnitude envelope samples as in feedforward filter 601 (FIG. 7). The envelope filters may also correspond to different filtered averages of past sample power or magnitude.

FIG. 9 is a functional block diagram of an envelope filter 900 implemented with a finite impulse response (FIR) digital filter, according to one embodiment of the present invention. Envelope filter 900 includes a sample power calculator 902, a delay circuit 904 and an adder 906. Delay circuit 904 and adder 906 form a FIR digital filter. In particular, sample power calculator 902 provides a signal representing the power of the current modulation signal sample to delay circuit 904 and adder 906. Delay circuit 906 then provides the power of the previous modulation signal sample to adder 906, which subtracts this previous modulation sample power from the current modulation signal power to generate the output signal of the envelope filter. In this embodiment, sample power calculator 902 and the FIR filter are implemented with a TMS320C44 DSP microprocessor and associated memory (not shown) using techniques well known in the art of digital linear transmitters.

FIG. 9A illustrates an envelope filter 910 similar to that in FIG. 9, but in which the sample power calculator is replaced by a sample magnitude calculator 912.

FIG. 10 is a functional block diagram of an envelope filter 1000 implemented with an infinite impulse response (IIR) digital filter, according to another embodiment of the present invention. Envelope filter 1000 includes sample power calculator 902, delay circuit 904, adder 906, a second delay circuit 1002 and a gain block 1004. Delay circuit 904, adder 906, delay circuit 1002 and gain block 1004 form an IIR digital filter. In particular, sample power calculator 902 provides a signal representing the power of the current modulation signal sample to delay circuit 904 and adder 906. Delay circuit 904 then provides the power of the previous modulation signal sample to adder 906. Adder 906 also receives a scaled version of the previous output sample of the envelope filter from delay circuit 1002 and gain block 1004. To ensure stability of the IIR digital filter, gain block 1004 scales each output sample before the output sample is stored in delay circuit 1002. Adder 906 then subtracts this previous modulation sample power from the sum of the current modulation signal power and the previous envelope filter output sample to generate the output signal of the envelope filter. In this embodiment, sample power calculator 902 and the IIR filter are implemented with a TMS320C44 DSP microprocessor and associated memory (not shown) using techniques well known in the art of digital linear transmitters.

FIG. 10A illustrates an envelope filter block 1010 similar to that in FIG. 10 but in which sample power calculator 902 is replaced by a sample magnitude calculator 1012.

Figure 11:
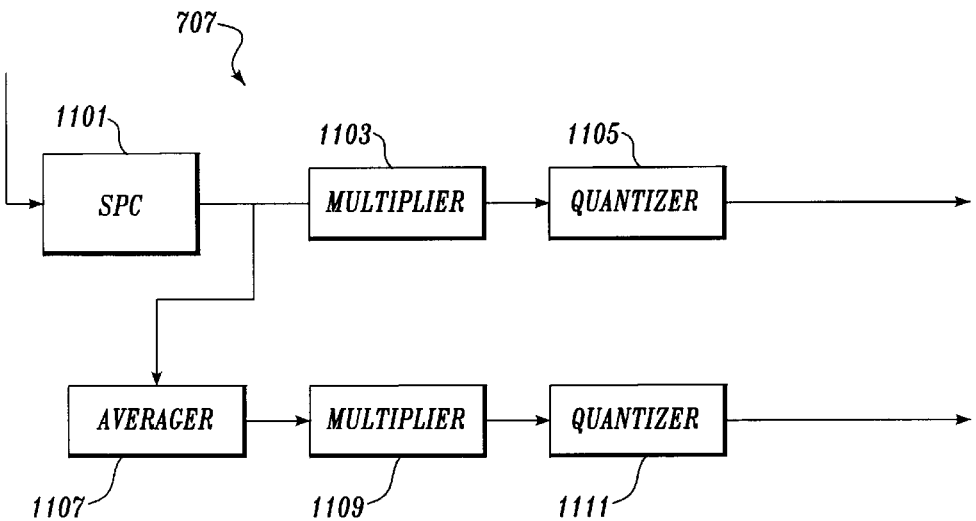
FIG. 11 is a functional block diagram of a lookup table address generator, according to one embodiment of the present invention.

FIG. 11 is a functional block diagram of address generator 707 of the feedforward filter 601 (FIG. 7), according to one embodiment of the present invention. Address generator 707 has a sample power calculator 1101, multipliers 1103 and 1109, quantizers 1105 and 1111, and an averager 1107. Sample power calculator 1101 receives the current modulation signal sample and outputs a signal representing the magnitude of the instantaneous power envelope of the current modulation signal sample. Alternatively, as will be appreciated by those skilled in the art of digital linearizers in view of the present disclosure, a sample magnitude calculator may be used instead of sample power calculator 1101 in other embodiments in which the feedforward scheme is based on the magnitude of the modulation signal instead of power. In this embodiment, the aforementioned TMS320C44 DSP microprocessor (not shown) implementing feedforward filter 601 (FIG. 7) is programmed to calculate the power (or magnitude) from the digital modulation signal samples.

The instantaneous power sample from the sample power calculator 1 101 is received by multiplier 1103, which then scales the instantaneous power sample by a constant in order to match the range of table memory addresses. The scaled instantaneous power sample is then quantized by quantizer 1105. This quantized value serves as the table address for LUT 603 (FIG. 7), which stores the values describing the complex characteristic for the branches of feedforward filter 601 (FIG. 7).

In addition, the instantaneous power sample from sample power calculator 1101 is received by averager 1107. In this embodiment, averager 1107 calculates the mean of the instantaneous power samples of the current and one or more previous power samples. This simple scheme provides a relatively good indication of the trajectory of the instantaneous power envelope of the current power sample without requiring a relatively large amount of processing time, memory and hardware. Of course, in other embodiments, the average may be calculated using different schemes. For example, the average may be calculated from a different number of previous power samples, or by using a weighted averaging scheme that gives less weight for the oldest power samples. Then, multiplier 1109 and quantizer 1111 provide the table address for the selection of alternative tables $806_1$–$806_M$ (FIG. 8) as described above for multiplier 1103 and quantizer 1105.

In a further refinement of multi-table embodiments (e.g., see LUTs $806_1$–$806_M$ in FIG. 8), the address generator can also receive control signals from the transmitter controller (not shown) indicative of the current modulation format (e.g., FSK, QAM, etc.) and whether the transmitter is ramping up or down in power at the start or finish of a transmission. As described in conjunction with FIG. 3, the transmitter controller provides the modulation signal samples to digital modulator 303. In light of this disclosure, those skilled in the art of digital transmitters can adapt the transmitter controller to provide these control signals without undue experimentation. In response to these control signals, the address generator then selects the LUT corresponding to the current combination of modulation format and state of the transmitter.

Figure 12:
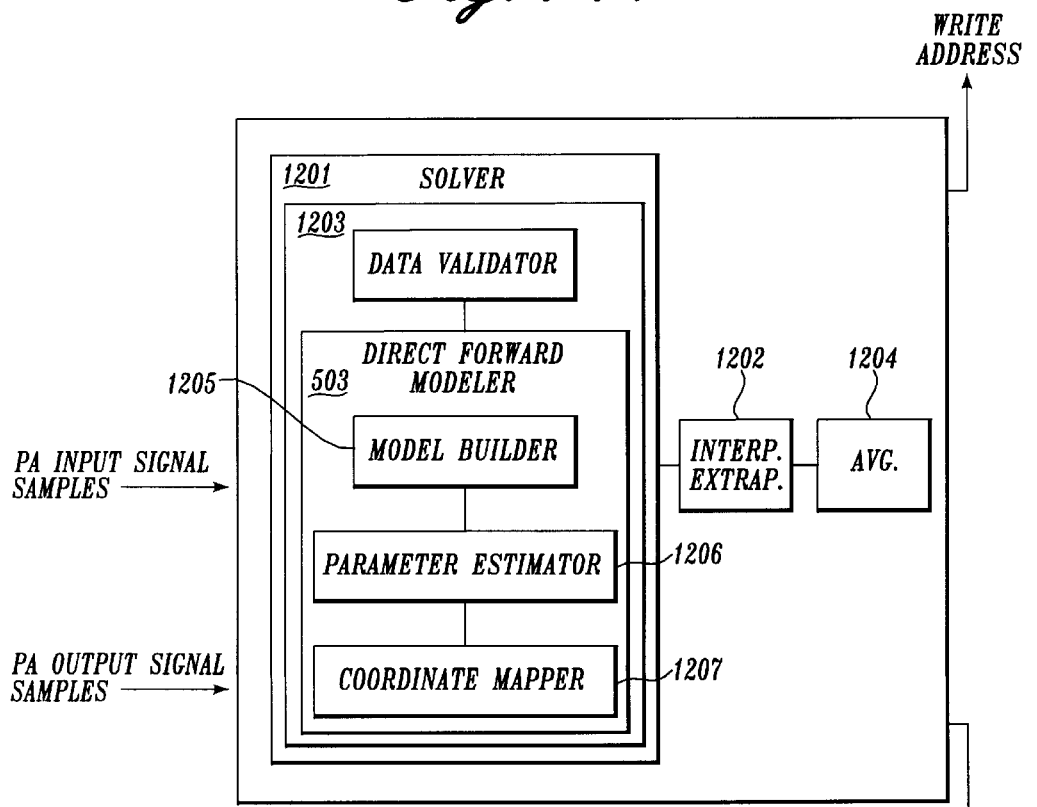
FIGS. 12, 12A and 12B are functional block diagrams of a trainer, according to several embodiments of the present invention.

FIG. 12 is a functional block diagram of the trainer 203 (FIG. 6), which includes a solver 1201, an interpolator/extrapolator 1202 and an averager 1204, according to one embodiment of the present invention. The solver 1201 includes the functionalities of a data validator 1203 and forward modeler 503. Forward modeler 503 includes a model builder 1205, a parameter estimator 1206 and a coordinate mapper 1207. In one embodiment, trainer 203, including solver 1201 is implemented with a TMS320C44 DSP microprocessor and associated memory.

In operation, the trainer 203 receives and stores the modulation signal samples from the transmitter controller (not shown). The trainer 203 also receives and stores from the digital decimator 329 (FIG. 3) complex digital signals that are scaled down, downconverted and digitized samples of the PA output signals from PA 101. These signals are referred to herein as the $PA_{out}$ samples.

In addition, trainer 203 receives and stores complex digital signal samples that are the digital modulated input signals to be amplified by PA 101. These signals are referred to herein as $PA_{in}$ samples. The trainer 203 then provides the proper delays and synchronization to match the $PA_{in}$ samples with the $PA_{out}$ samples.

Solver 1201 then periodically processes a "batch" or "block" of this stored data to generate the complex parameters used to update LUT 603 (FIG. 6) of forward modeler 503. In particular, trainer 203 uses the instantaneous power or magnitude of the modulation signal samples to generate the write addresses of LUT 603 at which the trainer stores the complex characteristics obtained by forward modeler 503 (i.e., indexing the LUT using the modulation signal samples). The write addresses are obtained in the same way as the read addresses are obtained by forward modeler 503, described in conjunction with FIG. 11 above.

In one embodiment, solver 1201 first performs interpolation to increase the number and time resolution of the samples used in the training. For example, this interpolation can be used to achieve, in effect, a 48 megasamples/second sampling rate. This interpolation has been found to improve the linearization of the transmitter output signals. Trainer 203 then quantizes the samples into "bins" that are equal in number to the number of table addresses in LUT 603. In a preferred embodiment, data validator 1203 checks that there are enough data samples in a bin and that their distribution is statistically significant (i.e., not too much variation). If the values associated with a bin are qualified by data validator 1203, then the $PA_{in}$ samples are processed by forward modeler 503 as described below. If the values are disqualified by data validator 1203, the bin is left empty.

To build the forward model of PA 101, model builder 1205 transforms the $PA_{in}$ samples to generate training signals (which are vectors) that are orthogonal to each other. These training signals are also referred to as "predictor variables." Training using orthogonal training signals is described in more detail in the aforementioned application Ser. No. 08/965,097. In light of the present disclosure, those skilled in the art of feedforward linearization can adapt the orthogonal training signal scheme disclosed in application Ser. No. 08/965,097 to the present model-based feedforward system without undue experimentation. The orthogonal training system is described in more detail in conjunction with FIGS. 13–16 below.

Parameter estimator 1206 then uses these orthogonal signals together with the $PA_{out}$ samples to derive new complex parameter values for the bin. In one embodiment of the present invention, a least squares method is employed by parameter estimator 1206 to compute complex parameters for each bin. Coordinate mapper 1207 then maps the complex parameters calculated by parameter estimator 1206 into the signal coordinate system used in feedforward filter 601. The values computed by coordinate mapper 1207 can then be used to update LUT 603.

Interpolator/extrapolator 1202 then determines the parameters of the empty bins (if any) by interpolation or extrapolation from other surrounding bins. In addition, interpolator/extrapolator 1202 estimates the value of the linear gain of PA 101, which is then used in ADM 205 (FIG. 6) to scale the amplitude of the digital input signals (generally from a digital modulator, an example of which is shown in FIG. 2). In a further refinement, each calculated parameter can be averaged or filtered in averager 1204 to smooth out changes in the parameter over time. For example, averager 1204 can average each calculated parameter with the corresponding parameter currently stored in the predistorter LUT.

Figure 12A:
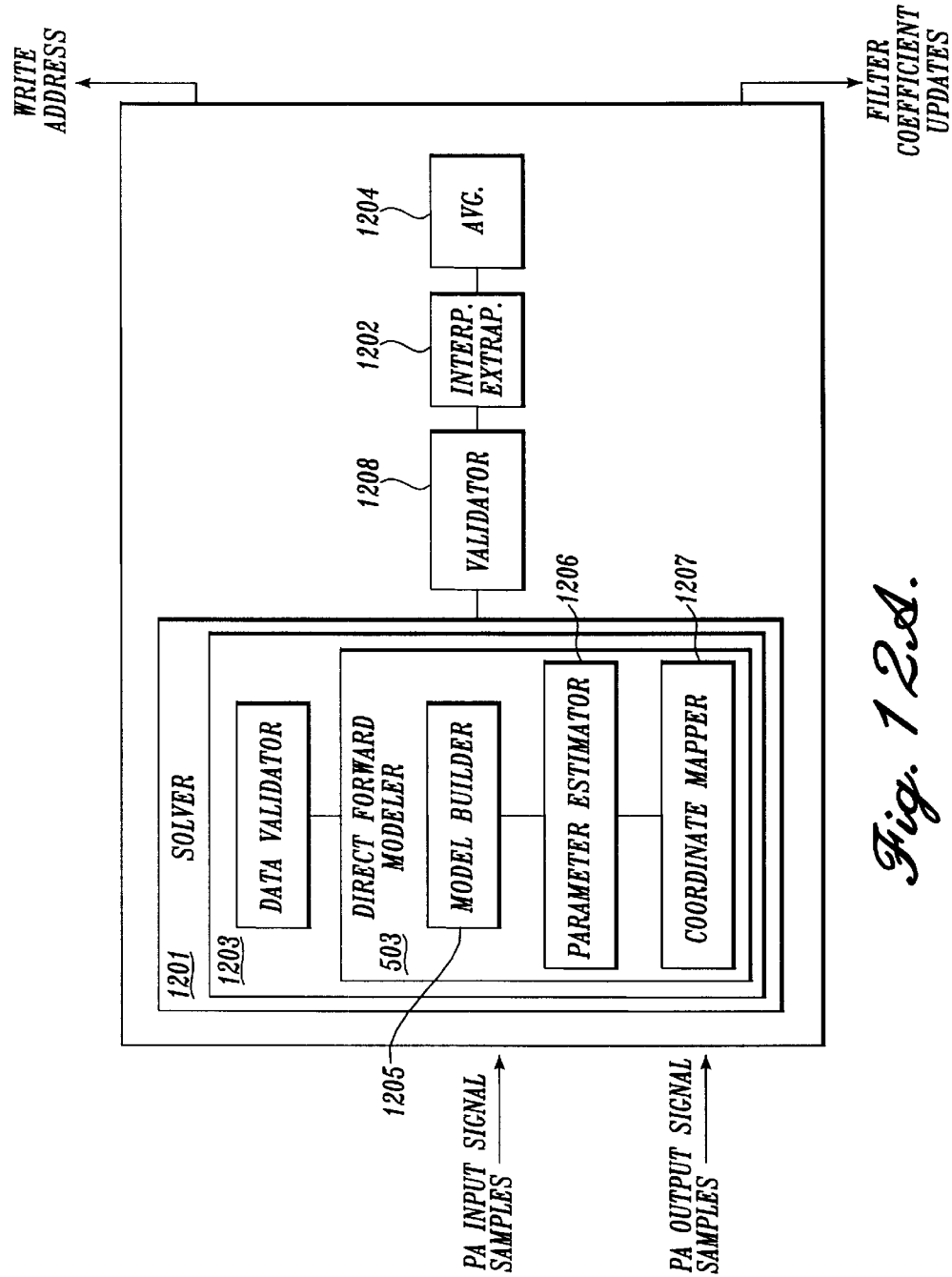

FIG. 12A is a functional block diagram of trainer 203 (FIG. 6), according to another embodiment of the present invention. This embodiment is substantially similar to the embodiment of FIG. 12, except for the inclusion of a validator 1208. This embodiment can be advantageously used to qualify the parameter estimates computed by coordinate mapper 1207, as follows. In the qualification process, validator 1208 checks each parameter value to determine whether it is reliable. For example, validator 1208 could check the magnitude of the complex parameters for each bin by comparing it to a predetermined threshold. If the magnitude of a complex parameter does not exceed the threshold, the parameter is considered reliable. As a result, only reliable parameters are used for processing in interpolator/extrapolator 1202 and averager 1204.

Figure 12B:
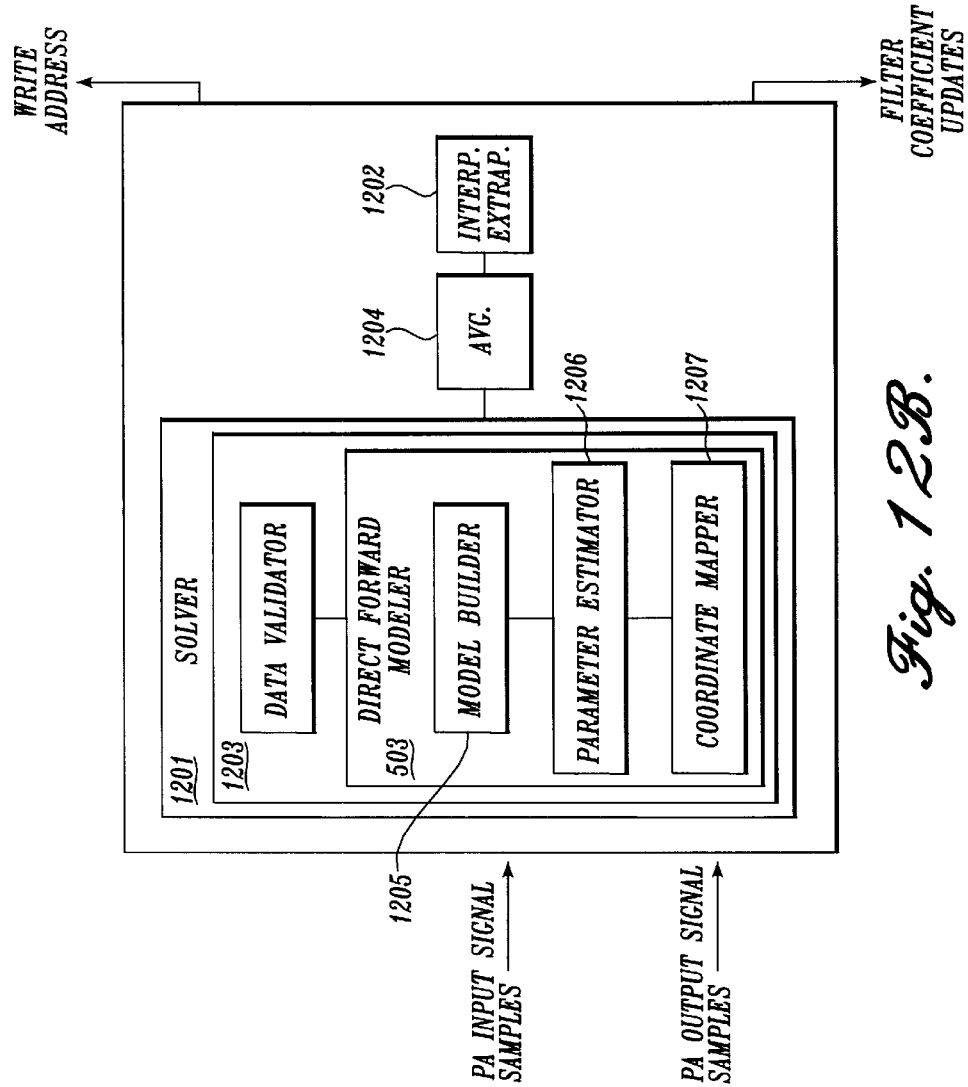

FIG. 12B is a functional block diagram of yet another embodiment of trainer 203. This embodiment is substantially similar to the embodiment of FIG. 12 except that averager 1204 is connected between solver 1201 and interpolator/extrapolator 1202. Thus, the calculated parameters are averaged with the stored parameters before the interpolation/extrapolation process.

FIG. 13 is a functional block diagram of solver 1201 (FIG. 12) according to one embodiment of the present invention. In this embodiment, solver 1201 includes data validator 1203, parameter estimator 1206, coordinate mapper 1207 and model builder 1205.

Model builder 1205 includes an envelope filter 1301, multipliers 1302, 1303 and 1304, an adder 1308, norm calculators 1305 and 1309, dividers 1306 and 1310, a conjugate transposer 1307 and a data buffer 1311. These elements are implemented in the TMS320C44 DSP microprocessor and associated memory of trainer 203 (as described in conjunction with FIG. 12). Solver 1201 receives the $PA_{in}$ and $PA_{out}$ samples formatted as column vectors, and the addresses corresponding to these samples in LUT 603 derived by the $PA_{in}$ samples. The $PA_{in}$ and $PA_{out}$ samples are qualified by data validator 1203, which allows further processing of these signals in solver 1201 only if the and $PA_{in}$ and $PA_{out}$ samples are reliable.

Envelope filter 1301 filters the $PA_{in}$ samples and provides an output signal as a function of previous $PA_{in}$ samples to multiplier 1302. In this embodiment, envelope filter 1301 is implemented in the same manner as envelope filter 900 (FIG. 9 or other versions depicted in FIGS. 9A, 10 or 10A) of feedforward filter 601 (FIG. 6). Consequently, the memory effects of the $PA_{in}$ samples are determined in the same manner as in feedforward filter 601.

In an upper signal branch of solver 1201, the $PA_{in}$ samples are scaled by divider 1306. Divider 1306 divides the imaginary and real components of the $PA_{in}$ samples by the Euclidean norm of the $PA_{in}$ vector, generating a training signal $\Phi_1$ in the form of a column vector. The Euclidean norm of the $PA_{in}$ vector is computed in norm calculator 1305. Training signal $\Phi_1$ is then fed into data buffer 1311 and multipliers 1303 and 1304.

In a second signal branch of solver 1201, multiplier 1302 multiplies the envelope filter output signal with the $PA_{in}$ samples. The output signal of multiplier 1302 is received by transposer 1307 and adder 1308. Transposer 1307 computes the conjugate transpose of the output signal of multiplier 1302 to produce a row vector. Multiplier 1303 multiplies this row vector with the column vector generated by divider 1306 (i.e., training signal $\Phi_1$), generating thereby a complex value g. Multiplier 1304 then receives the constant g and scales training signal $\Phi_1$ by multiplying training signal $\Phi_1$ with constant g. Adder 1308 then subtracts the output signal of multiplier 1304 from the output signal of multiplier 1302, generating a column vector $v_2$. Column vector $v_2$ is then normalized by norm calculator 1309 and divider 1310 to produce a second training signal $\Phi_2$.

As a result of the computational procedure described above, training signals $\Phi_1$ and $\Phi_2$ (also known as predictor variables) are approximately orthogonal to each other. This training technique can be advantageously used to characterize the forward PA transfer characteristic that is computed by solver 1201. Also, this procedure enables trainer 203 to gather more precise and useful information out of the $PA_{in}$ signal. Consequently, forward modeler 503 is better trained and feedforward performance is significantly improved as compared to the aforementioned conventional feedforward linearizers.

The orthogonal training signals $\Phi_1$ and $\Phi_2$, together with the $PA_{out}$ samples and the corresponding LUT addresses are stored in data buffer 1311. Parameter estimator 1206 then accesses the data in data buffer 1311 to calculate the values of the complex parameters for the bin. These complex parameters are processed by coordinate mapper 1207, which maps them into the signal coordinate system used in the feedforward filter 601. The operation of coordinate mapper 1207 is described below in conjunction with FIG. 15. The parameter values computed by coordinate mapper 1207 are then used as a basis for updating LUT 603 of forward model 501. In one embodiment, the parameter values are processed by averager 1204 and interpolator/extrapolator 1202 (FIGS. 12 and 12B) to generate the values for updating LUT 603, as described further below in conjunction with FIG. 15.

In an alternative embodiment, additional envelope filters, multipliers, dividers, adders and norm calculators may be included in solver 1201 to implement other memory effect modeling algorithms. Each additional envelope filter adds an extra orthogonal training signal $\Phi_i$. In light of this disclosure, those skilled in the art of feedforward linearization can, without undue experimentation, configure solver 1201 to use appropriate algorithms similar to the algorithms used in the two-level memory effect model to process this increased amount of data.

FIG. 14 is a block diagram of a DSP module 1400 for implementing a forward modeler and trainer, according to one embodiment of the present invention. DSP module 1400 includes a microprocessor 1401, a static random access memory (SRAM) 1403 and a nonvolatile memory (NVM) 1405. In a preferred embodiment, microprocessor 1401 is a DSP microprocessor TMS320C44 available from Texas Instruments, although any suitable microprocessor can be used. Microprocessor 1401 is connected to SRAM 1403 and NVM 1405. In this embodiment, NVM 1405 is implemented using a flash electrically programmable read only memory (EPROM). As a result, DSP module 1400 can be configured or programmed for a variety of functions, such as, for example, forming part of a modulator, interpolator, trainer or forward modeler. Further, DSP module 1400 can be reprogrammed to change its functionality by replacing the configuration program stored in NVM 1405.

Further, when implementing forward modeler 503 (FIG. 6) with a DSP module 400, forward modeler 503 can, on powerdown, store the feedforward values in the nonvolatile memory 405. As a result, forward modeler 503 can use these stored values immediately after power up to implement the feedforward linearization scheme. Thus, in this embodiment, forward modeler 503 does not require a special initialization process with special training sequences as required in some conventional systems.

Additionally, a DSP module implementing digital modulator 303 (FIG. 3) can be programmed to scale the in-phase and quadrature output signals at start-up and powerdown to "ramp" the input signals to the power amplifier using a LUT containing a smooth ramping function of multiplier factors, thereby reducing transients in the power supply voltages and spurious output signal from the power amplifier. In a preferred embodiment, a Gaussian scaling is used. Smooth ramping can be individually applied to individual subcarriers when more than one is transmitted simultaneously.

Figure 15:
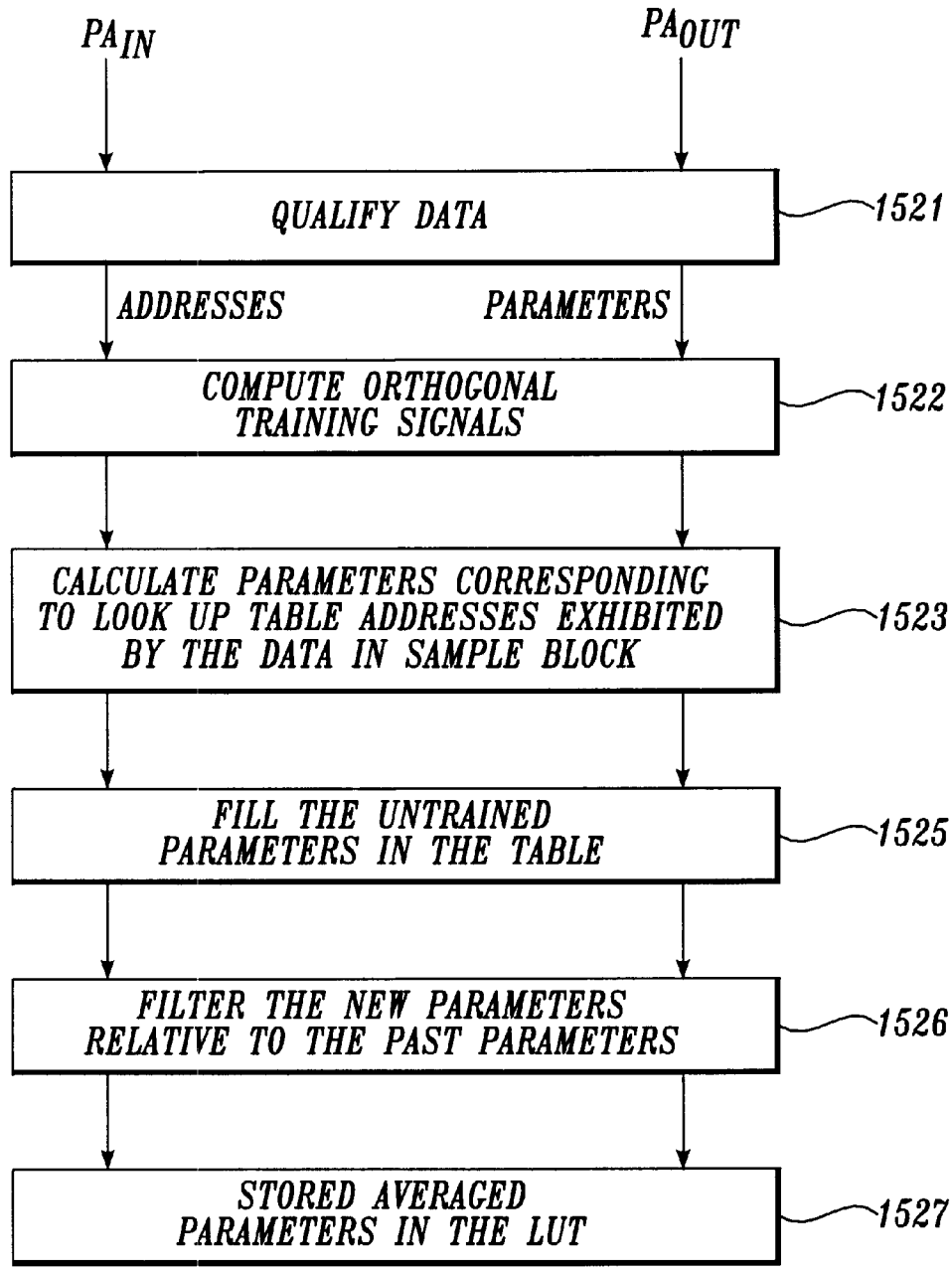
FIG. 15 is a flow diagram illustrative of the operation of the solver, according to one embodiment of the present invention.

FIG. 15 is a flow diagram illustrative of the process of determining complex parameters for updating LUT 603 (FIG. 6), according to one embodiment of the present invention. Referring to FIGS. 12, 13 and 15, solver 1201 receives a block of synchronized modulation signal samples, $PA_{in}$ samples, $PA_{out}$ samples and LUT addresses. As described above in conjunction with FIG. 12, these samples are quantized into bins corresponding to LUT addresses. The samples may also be interpolated to increase their numbers as described in conjunction with FIG. 12. The $PA_{in}$ and $PA_{out}$ samples are qualified by data validator 1203 in a step 1521.

If the samples are reliable, solver 1201 then calculates complex parameters for each bin by first computing the orthogonal training signals $\Phi_1$ and $\Phi_2$ in a step 1522. Then in a step 1523, solver 1201 calculates complex parameters corresponding to the addresses in LUT 603. In particular, solver 1201 uses the orthogonal training signals to solve for the parameter estimates of the forward PA model. In one embodiment, solver 1201 uses a least squares technique is used for computing the parameter estimates. More specifically, for each bin, solver 1201 solves the regression equation:

$$PA_{OUTi} = CG_{\perp i} \times \Phi_{1i} + CG2_{\perp i} \times \Phi_{2i} \qquad (1)$$

where $PA_{OUTi}$ denotes the set of $PA_{OUT}$ samples for bin i, $CG_{\perp i}$ and $CG2_{\perp i}$ are complex coefficients for bin i, and $\Phi_{1i}$ and $\Phi_{2i}$ are orthogonal training signals for bin i computed as described above in conjunction with FIG. 13.

The values of $CG_{\perp i}$ and $CG2_{\perp i}$ are calculated by parameter estimator 1206 according to the following definitions:

$$CG_{\perp i} = \Phi_{1i}' \times PA_{OUTi} \qquad (2)$$

$$CG2_{\perp i} = \Phi_{2i}' \times PA_{OUTi} \qquad (3)$$

The prime (') indicator denotes the conjugate transpose operator.

Coordinate mapper 1207 transforms $CG_{\perp i}$ and $CG2_{\perp i}$ to generate values suitable for updating LUT 603 with trained parameters. This coordinate transformation is accomplished according to the following definitions below:

$$CG2_i = \frac{CG2_{\perp i}}{\|v_2\|} \qquad (4)$$

$$CG_i = \frac{1}{\|PA_{in_i}\|} \times (CG_{\perp i} - (g \times CG2_i)) \qquad (5)$$

where $PA_{in i}$ denotes the set of $PA_{in}$ samples for bin i.

In a step 1525, interpolator/extrapolator fills the untrained parameters (i.e., empty bins) in LUT 603 by interpolation or extrapolation from other surrounding bins. Then averager 1206 computes a weighted average of these new parameters and the current parameters in a step 1526. Typically, the averaging is done so that the more weight is given to the most recent parameters. These weighted averages are then used to update LUT 603 at step 1527.

Figure 16:
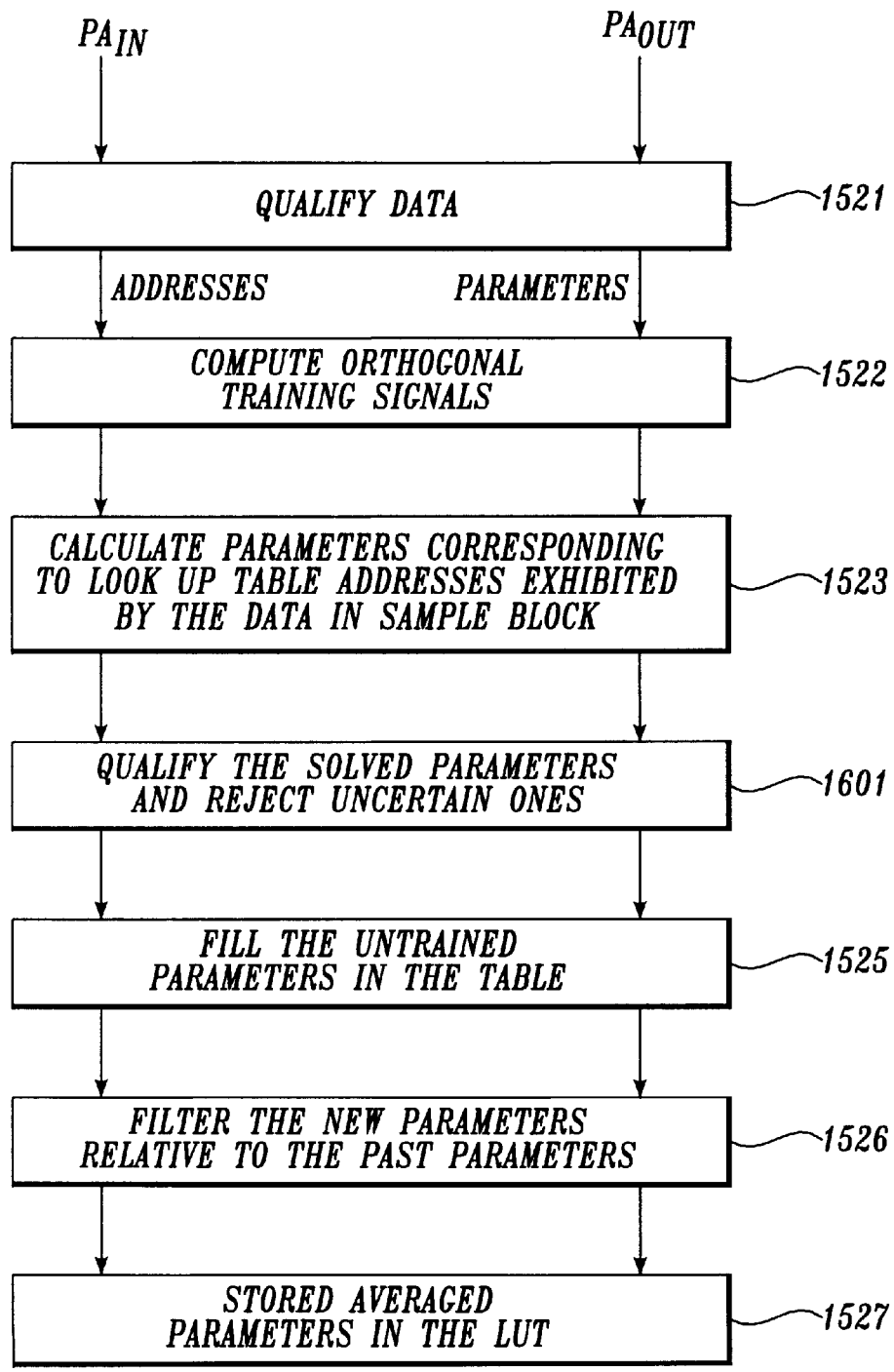
FIG. 16 is a flow diagram illustrative of the operation of the solver, according to an alternative embodiment of the present invention.

FIG. 16 is a flow diagram illustrative of the process of determining complex parameters for updating LUT 603 (FIG. 6), according to another embodiment of the present invention. This embodiment is substantially similar to the embodiment described in conjunction with FIG. 15 except that the extra validation process is performed after the calculation of the parameters. In particular, after step 1523, a step 1601 is performed in which a threshold value is set in validator 1208. If the magnitude of the computed parameters exceeds the threshold, the coefficients for the bin are considered unreliable and the bin is emptied.

In an alternative embodiment, the filtering step 1526 may be performed before the step 1525. That is, the calculated parameter values may be averaged with the corresponding current (or, alternatively, a running weighted average of the past values) parameters stored in LUT 603 before empty bins are interpolated or extrapolated. Accordingly, in this alternative embodiment, averaging only takes place with calculated parameters that have passed the validation process.

The embodiments of the feedforward system described above are illustrative of the principles of the present invention and are not intended to limit the invention to the particular embodiments described. For example, devices other than the devices described for the DSP microprocessors, A/D converters, FPGAs and decimating filter devices can be used in other embodiments. Accordingly, while the preferred embodiment of the invention has been illustrated and described, it will be appreciated that in light of the present disclosure, various changes can be made to the described embodiments without departing from the spirit and scope of the invention.

The embodiments of the invention in which an exclusive property or privilege is claimed are defined as follows:

1. A method for compensating for distortion caused by a power amplifier in a radio frequency (RF) transmitter, the method comprising:
   providing a forward model of the power amplifier, wherein the forward model represents a transfer characteristic of the power amplifier;
   generating a modeled power amplifier output signal using the forward model, wherein the forward model generates the modeled power amplifier output signal as a function of an input signal;
   generating an error signal as a function of the modeled power amplifier output signal and the input signal;
   providing the input signal to the power amplifier, wherein, responsive to the input signal, the power amplifier generates an amplified output signal; and
   combining the error signal with the power amplifier output signal so as to cancel distortion in the amplified output signal.

2. The method of claim 1 wherein the modeled power amplifier output signal and the error signal are digital signals.

3. The method of claim 1 wherein providing a forward model of the power amplifier comprises forming a table of values indexed by predetermined ranges of input signal sample instantaneous power, the table of values including filter coefficients of a digital filter.

4. The method of claim 1 wherein generating a modeled power amplifier output signal comprises generating the modeled power amplifier output signal as a function of an input signal sample and at least one prior input signal sample.

5. The method of claim 1 wherein providing a forward model of the power amplifier comprises calculating a set of mutually orthogonal predictor variables as a function of the input signal.

6. The method of claim 5 wherein providing a forward model of the power amplifier further comprises calculating first parameter values as a function of the set of predictor variables and amplified output signal samples.

7. The method of claim 6 wherein the first parameter values are calculated from a plurality of amplified output signal samples.

8. The method of claim 6 wherein providing a forward model of the power amplifier further comprises mapping the first parameter values into second parameter values that are based on a coordinate system of the forward model.

9. The method of claim 8 wherein the forward model is periodically updated with the second parameter values.

10. An apparatus for compensating for distortion caused by a power amplifier in a radio frequency (RF) transmitter, the apparatus comprising:
    means for modeling a forward transfer characteristic of the power amplifier, wherein, responsive to an input signal, the means for modeling generates a modeled power amplifier output signal as a function of the input signal;
    means for generating an error signal as a function of the modeled power amplifier output signal and the input signal;
    means for providing the input signal to the power amplifier, wherein, responsive to the input signal, the power amplifier generates an amplified output signal; and
    means for combining the error signal with the power amplifier output signal so as to cancel distortion in the amplified output signal.

11. The apparatus of claim 10 wherein the modeled power amplifier output signal and the error signal are digital signals.

12. The apparatus of claim 10 wherein the means for modeling comprises means for forming a table of values indexed by predetermined ranges of instantaneous power of a sample of the input signal, the table of values including filter coefficients of a digital filter.

13. The apparatus of claim 10 the means for modeling comprises means for generating the modeled power amplifier output signal as a function of an input signal sample and at least one prior input signal sample.

14. The apparatus of claim 10 wherein the means for modeling comprises means for calculating a set of mutually orthogonal predictor variables as a function of the input signal.

15. The apparatus of claim 14 wherein the means for modeling further comprises means for calculating first parameter values as a function of the set of predictor variables and amplified output signal samples.

16. The apparatus of claim 15 wherein the means for modeling further comprises means for mapping the first parameter values into second parameter values that are based on a signal coordinate system of the modeled power amplifier signal.

17. A radio frequency (RF) transmitter assembly comprising:
    a first digital-to-analog (D/A) converter coupled to receive a digital input signal, wherein, responsive to the digital input signal, the first D/A converter is configured to generate an analog input signal;
    a power amplifier (PA) coupled to receive the analog input signal, wherein, responsive to the analog input signal, the PA is configured to generate an amplified output signal;
    a forward model circuit (FMC) coupled to receive the digital input signal, wherein the FMC is configured with a stored forward model and wherein the FMC is operative to generate a modeled PA output signal as a function of the digital input signal and the stored forward model;
    an amplitude and delay matching circuit (ADM) coupled to receive the digital input signal, wherein the ADM is configured to scale the digital input signal's amplitude to generate a scaled digital input signal;
    a first combiner coupled to receive the scaled digital input signal and the modeled PA output signal, wherein the first combiner is configured to generate an error signal as a function of the scaled digital input signal and the modeled PA output signal;
    a second D/A converter coupled to receive the error signal, wherein the second D/A converter is configured to generate an analog error signal; and
    a second combiner coupled to receive the amplified output signal and the analog error signal, wherein the second combiner is configured to generate a transmitter output signal as a function of the amplified output signal and the analog error signal.

18. The assembly of claim 17 wherein the FMC comprises a configurable digital filter and a lookup table storing coefficients for the configurable digital filter.

19. The assembly of claim 17 wherein the error signal represents the difference of the scaled digital input signal and the modeled PA output signal.

20. The assembly of claim 17 wherein the transmitter output signal represents the difference of the amplified output signal and the analog error signal.

21. The assembly of claim 17 wherein the modeled PA output signal is a function of an input signal sample and at least one prior input signal sample.

22. The assembly of claim 17, further comprising:
   a coupler coupled to an output lead of the PA, wherein the coupler is configured to generate a PA output signal as a function of the amplified output signal;
   an analog-to-digital (A/D) converter coupled to receive the PA output signal, wherein the A/D converter is configured to generate a digital PA output sample representing the PA output signal; and
   a trainer coupled to receive the digital input signal and the digital PA output sample, wherein the trainer is configured to generate a forward model of the PA as a function of at least the digital input signal and the digital PA output sample, wherein the generated forward model is used to update the forward model stored in the FMC.

23. The assembly of claim 22 further comprising a frequency selectivity circuit coupled between the trainer and the A/D converter, wherein the frequency selectivity circuit is configured to reduce in-band distortion in PA output sample used by the trainer in generating the forward model of the PA.

24. The assembly of claim 22 wherein the trainer, the FMC, the ADM and the first combiner are implemented using a digital signal processor and associated memory.

25. The assembly of claim 22 wherein the trainer is configured to calculate a set of mutually orthogonal predictor variables as a function of the input signal.

26. The assembly of claim 22 wherein the trainer is configured to calculate first parameter values as a function of the set of predictor variables and amplified output signal samples.

27. The assembly of claim 26 wherein the trainer is configured to map the first parameter values into second parameter values that are based on a signal coordinate system used by the FMC.

* * * * *